(12) United States Patent
Walsh et al.

(10) Patent No.: US 9,268,441 B2
(45) Date of Patent: Feb. 23, 2016

(54) ACTIVE INTEGRATOR FOR A CAPACITIVE SENSE ARRAY

(75) Inventors: Paul Walsh, Blackrock (IE); Hans W. Klein, Pleasanton, CA (US); Keith O'Donoghue, Ballyvolane (IE); Erik Anderson, Shorelin, WA (US); Erhan Hancioglu, Bothell, WA (US); Gajender Rohilla, Bothell, WA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 823 days.

(21) Appl. No.: 13/249,514

(22) Filed: Sep. 30, 2011

(65) Prior Publication Data

US 2012/0256869 A1   Oct. 11, 2012

Related U.S. Application Data

(60) Provisional application No. 61/472,161, filed on Apr. 5, 2011.

(51) Int. Cl.
 *G06F 3/044*  (2006.01)
 *G06F 3/0354* (2013.01)
 *G06F 3/041*  (2006.01)
 *G01R 27/26*  (2006.01)

(52) U.S. Cl.
 CPC ............ *G06F 3/044* (2013.01); *G01R 27/2605* (2013.01); *G06F 3/03547* (2013.01); *G06F 3/041* (2013.01); *G06F 3/0416* (2013.01); *G06F 3/0418* (2013.01); *G06F 2203/04103* (2013.01); *G06F 2203/04111* (2013.01)

(58) Field of Classification Search
 CPC ..... G06F 3/044; G06F 3/0416; G06F 3/0418; G06F 2203/04103; G06F 3/041; G06F 2203/0411; G06F 3/03547; G01R 27/2605
 USPC ...................... 345/173–178; 178/18.01–18.11
 See application file for complete search history.

(56) References Cited

U.S. PATENT DOCUMENTS

| | | | |
|---|---|---|---|
| 4,039,940 | A | 8/1977  | Butler et al. |
| 4,145,748 | A | 3/1979  | Eichelberger et al. |
| 4,264,903 | A | 4/1981  | Bigelow |
| 4,283,713 | A | 8/1981  | Philipp |
| 4,293,734 | A | 10/1981 | Pepper |
| 4,438,404 | A | 3/1984  | Philipp |
| 4,475,151 | A | 10/1984 | Philipp |
| 4,497,575 | A | 2/1985  | Philipp |

(Continued)

FOREIGN PATENT DOCUMENTS

WO    WO2007128682 A1   11/2007
WO       2008085720 A    7/2008

OTHER PUBLICATIONS

CN Office Action, 201080013632.1, dated Aug. 26, 2013, 6 pg.

(Continued)

*Primary Examiner* — Dmitriy Bolotin
(74) *Attorney, Agent, or Firm* — Morgan, Lewis & Bockius LLP

(57) ABSTRACT

An active integrator for sensing capacitance of a touch sense array is disclosed. The active integrator is configured to receive from the touch sense array a response signal having a positive portion and a negative portion. The response signal is representative of a presence or an absence of a conductive object on the touch sense array. The active integrator is configured to continuously integrate the response signal.

20 Claims, 11 Drawing Sheets

(56) References Cited

U.S. PATENT DOCUMENTS

| | | | |
|---|---|---|---|
| 4,614,937 | A | 9/1986 | Poujois |
| 4,728,932 | A | 3/1988 | Atherton |
| 4,736,097 | A | 4/1988 | Philipp |
| 4,736,191 | A | 4/1988 | Matzke et al. |
| 4,742,331 | A | 5/1988 | Barrow et al. |
| 4,772,983 | A | 9/1988 | Kerber et al. |
| 4,773,024 | A | 9/1988 | Faggin et al. |
| 4,802,103 | A | 1/1989 | Faggin et al. |
| 4,825,147 | A | 4/1989 | Cook et al. |
| 4,876,534 | A | 10/1989 | Mead et al. |
| 4,879,461 | A | 11/1989 | Philipp |
| 4,879,505 | A | 11/1989 | Barrow et al. |
| 4,920,399 | A | 4/1990 | Hall |
| 4,935,702 | A | 6/1990 | Mead et al. |
| 4,940,980 | A | 7/1990 | Tice |
| 4,953,928 | A | 9/1990 | Anderson et al. |
| 4,962,342 | A | 10/1990 | Mead et al. |
| 4,982,333 | A | 1/1991 | Ackerman et al. |
| 5,049,758 | A | 9/1991 | Mead et al. |
| 5,055,719 | A | 10/1991 | Hughes |
| 5,055,827 | A | 10/1991 | Philipp |
| 5,059,920 | A | 10/1991 | Anderson et al. |
| 5,068,622 | A | 11/1991 | Mead et al. |
| 5,073,759 | A | 12/1991 | Mead et al. |
| 5,083,044 | A | 1/1992 | Mead et al. |
| 5,095,284 | A | 3/1992 | Mead |
| 5,097,305 | A | 3/1992 | Mead et al. |
| 5,107,149 | A | 4/1992 | Platt et al. |
| 5,109,261 | A | 4/1992 | Mead et al. |
| 5,119,038 | A | 6/1992 | Anderson et al. |
| 5,120,996 | A | 6/1992 | Mead et al. |
| 5,122,800 | A | 6/1992 | Philipp |
| 5,126,685 | A | 6/1992 | Platt et al. |
| 5,146,106 | A | 9/1992 | Anderson et al. |
| 5,160,899 | A | 11/1992 | Anderson et al. |
| 5,165,054 | A | 11/1992 | Platt et al. |
| 5,166,562 | A | 11/1992 | Allen et al. |
| 5,204,549 | A | 4/1993 | Platt et al. |
| 5,243,554 | A | 9/1993 | Allen et al. |
| 5,248,873 | A | 9/1993 | Allen et al. |
| 5,260,592 | A | 11/1993 | Mead et al. |
| 5,270,963 | A | 12/1993 | Allen et al. |
| 5,276,407 | A | 1/1994 | Mead et al. |
| 5,281,862 | A | 1/1994 | Ma |
| 5,289,023 | A | 2/1994 | Mead |
| 5,294,889 | A | 3/1994 | Heep et al. |
| 5,303,329 | A | 4/1994 | Mead et al. |
| 5,305,017 | A | 4/1994 | Gerpheide |
| 5,323,158 | A | 6/1994 | Ferguson |
| 5,324,958 | A | 6/1994 | Mead et al. |
| 5,331,215 | A | 7/1994 | Allen et al. |
| 5,336,936 | A | 8/1994 | Allen et al. |
| 5,339,213 | A | 8/1994 | O'Callaghan |
| 5,349,303 | A | 9/1994 | Gerpheide |
| 5,374,787 | A | 12/1994 | Miller et al. |
| 5,381,515 | A | 1/1995 | Platt et al. |
| 5,384,467 | A | 1/1995 | Plimon et al. |
| 5,408,194 | A | 4/1995 | Steinbach et al. |
| 5,412,387 | A | 5/1995 | Vincelette et al. |
| 5,442,347 | A | 8/1995 | Vranish |
| 5,488,204 | A | 1/1996 | Mead et al. |
| 5,495,077 | A | 2/1996 | Miller et al. |
| 5,541,600 | A | 7/1996 | Blumenkrantz et al. |
| 5,541,878 | A | 7/1996 | LeMoncheck et al. |
| 5,543,588 | A | 8/1996 | Bisset et al. |
| 5,543,590 | A | 8/1996 | Gillespie et al. |
| 5,543,591 | A | 8/1996 | Gillespie et al. |
| 5,555,907 | A | 9/1996 | Philipp |
| 5,565,658 | A | 10/1996 | Gerpheide et al. |
| 5,566,702 | A | 10/1996 | Philipp |
| 5,572,205 | A | 11/1996 | Caldwell et al. |
| 5,629,629 | A | 5/1997 | Tielert et al. |
| 5,629,891 | A | 5/1997 | LeMoncheck et al. |
| 5,648,642 | A | 7/1997 | Miller et al. |
| 5,672,959 | A | 9/1997 | Der |
| 5,682,032 | A | 10/1997 | Philipp |
| 5,684,487 | A | 11/1997 | Timko |
| 5,730,165 | A | 3/1998 | Philipp |
| 5,757,368 | A | 5/1998 | Gerpheide et al. |
| 5,760,852 | A | 6/1998 | Wu et al. |
| 5,763,909 | A | 6/1998 | Mead et al. |
| 5,763,924 | A | 6/1998 | Lum et al. |
| 5,767,457 | A | 6/1998 | Gerpheide et al. |
| 5,796,183 | A | 8/1998 | Hourmand |
| 5,801,340 | A | 9/1998 | Peter |
| 5,812,698 | A | 9/1998 | Platt et al. |
| 5,841,078 | A | 11/1998 | Miller et al. |
| 5,844,265 | A | 12/1998 | Mead et al. |
| 5,854,625 | A | 12/1998 | Frisch et al. |
| 5,861,583 | A | 1/1999 | Schediwy et al. |
| 5,861,875 | A | 1/1999 | Gerpheide |
| 5,864,242 | A | 1/1999 | Allen et al. |
| 5,864,392 | A | 1/1999 | Winklhofer et al. |
| 5,880,411 | A | 3/1999 | Gillespie et al. |
| 5,889,236 | A | 3/1999 | Gillespie et al. |
| 5,914,465 | A | 6/1999 | Allen et al. |
| 5,914,708 | A | 6/1999 | LaGrange et al. |
| 5,920,309 | A | 7/1999 | Bisset et al. |
| 5,920,310 | A | 7/1999 | Faggin et al. |
| 5,926,566 | A | 7/1999 | Wang et al. |
| 5,942,733 | A | 8/1999 | Allen et al. |
| 5,943,052 | A | 8/1999 | Allen et al. |
| 5,969,513 | A | 10/1999 | Clark |
| 6,023,422 | A | 2/2000 | Allen et al. |
| 6,028,271 | A | 2/2000 | Gillespie et al. |
| 6,028,959 | A | 2/2000 | Wang et al. |
| 6,097,432 | A | 8/2000 | Mead et al. |
| 6,148,104 | A | 11/2000 | Wang et al. |
| 6,151,967 | A | 11/2000 | McIntosh et al. |
| 6,185,450 | B1 | 2/2001 | Seguine et al. |
| 6,188,228 | B1 | 2/2001 | Philipp |
| 6,188,391 | B1 | 2/2001 | Seely et al. |
| 6,191,723 | B1 | 2/2001 | Lewis |
| 6,211,743 | B1 | 4/2001 | Rhee et al. |
| 6,222,528 | B1 | 4/2001 | Gerpheide et al. |
| 6,239,389 | B1 | 5/2001 | Allen et al. |
| 6,249,447 | B1 | 6/2001 | Boylan et al. |
| 6,262,717 | B1 | 7/2001 | Donohue et al. |
| 6,271,719 | B1 | 8/2001 | Sevastopoulos |
| 6,271,720 | B1 | 8/2001 | Sevastopoulos |
| 6,280,391 | B1 | 8/2001 | Olson et al. |
| 6,288,707 | B1 | 9/2001 | Philipp |
| 6,304,014 | B1 | 10/2001 | England et al. |
| 6,320,184 | B1 | 11/2001 | Winklhofer et al. |
| 6,323,846 | B1 | 11/2001 | Westerman et al. |
| 6,326,859 | B1 | 12/2001 | Goldman et al. |
| 6,342,817 | B1 | 1/2002 | Crofts et al. |
| 6,344,773 | B1 | 2/2002 | Sevastopoulos et al. |
| 6,353,200 | B1 | 3/2002 | Schwankhart |
| 6,366,099 | B1 | 4/2002 | Reddi |
| 6,377,009 | B1 | 4/2002 | Philipp |
| 6,380,929 | B1 | 4/2002 | Platt |
| 6,380,931 | B1 | 4/2002 | Gillespie et al. |
| 6,414,671 | B1 | 7/2002 | Gillespie et al. |
| 6,430,305 | B1 | 8/2002 | Decker |
| 6,441,073 | B1 | 8/2002 | Tanaka et al. |
| 6,441,682 | B1 | 8/2002 | Vinn et al. |
| 6,445,257 | B1 | 9/2002 | Cox et al. |
| 6,452,514 | B1 | 9/2002 | Philipp |
| 6,457,355 | B1 | 10/2002 | Philipp |
| 6,459,321 | B1 | 10/2002 | Belch |
| 6,466,036 | B1 | 10/2002 | Philipp |
| 6,473,069 | B1 | 10/2002 | Gerpheide |
| 6,489,899 | B1 | 12/2002 | Ely et al. |
| 6,498,720 | B2 | 12/2002 | Glad |
| 6,499,359 | B1 | 12/2002 | Washeleski et al. |
| 6,522,083 | B1 | 2/2003 | Roach |
| 6,522,128 | B1 | 2/2003 | Ely et al. |
| 6,522,187 | B1 | 2/2003 | Sousa |
| 6,523,416 | B2 | 2/2003 | Takagi et al. |
| 6,534,970 | B1 | 3/2003 | Ely et al. |
| 6,535,200 | B2 | 3/2003 | Philipp |
| 6,570,557 | B1 | 5/2003 | Westerman et al. |
| 6,587,093 | B1 | 7/2003 | Shaw et al. |

(56) References Cited

U.S. PATENT DOCUMENTS

| | | |
|---|---|---|
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,693,572 B1 | 2/2004 | Oliaei et al. |
| 6,700,392 B2 | 3/2004 | Haase |
| 6,704,005 B2 | 3/2004 | Kato et al. |
| 6,705,511 B1 | 3/2004 | Dames et al. |
| 6,714,817 B2 | 3/2004 | Daynes et al. |
| 6,730,863 B1 | 5/2004 | Gerpheide et al. |
| 6,750,852 B2 | 6/2004 | Gillespie et al. |
| 6,774,644 B2 | 8/2004 | Eberlein |
| 6,788,221 B1 | 9/2004 | Ely et al. |
| 6,788,521 B2 | 9/2004 | Nishi |
| 6,798,218 B2 | 9/2004 | Kasperkovitz |
| 6,809,275 B1 | 10/2004 | Cheng et al. |
| 6,856,433 B2 | 2/2005 | Hatano et al. |
| 6,859,159 B2 | 2/2005 | Michalski |
| 6,873,203 B1 | 3/2005 | Latham et al. |
| 6,879,215 B1 | 4/2005 | Roach |
| 6,888,536 B2 | 5/2005 | Westerman et al. |
| 6,888,538 B2 | 5/2005 | Ely et al. |
| 6,893,724 B2 | 5/2005 | Lin et al. |
| 6,903,402 B2 | 6/2005 | Miyazawa |
| 6,904,570 B2 | 6/2005 | Foote et al. |
| 6,914,547 B1 | 7/2005 | Swaroop et al. |
| 6,933,873 B1 | 8/2005 | Horsley et al. |
| 6,949,811 B2 | 9/2005 | Miyazawa |
| 6,958,594 B2 | 10/2005 | Redl et al. |
| 6,969,978 B2 | 11/2005 | Dening |
| 6,970,120 B1 | 11/2005 | Bjornsen |
| 6,970,126 B1 | 11/2005 | McCartney |
| 6,975,123 B1 | 12/2005 | Malang et al. |
| 6,993,607 B2 | 1/2006 | Philipp |
| 7,030,782 B2 | 4/2006 | Ely et al. |
| 7,031,886 B1 | 4/2006 | Hargreaves |
| 7,032,051 B2 | 4/2006 | Reay et al. |
| 7,046,230 B2 | 5/2006 | Zadesky et al. |
| 7,078,916 B2 | 7/2006 | Denison |
| 7,109,978 B2 | 9/2006 | Gillespie et al. |
| 7,119,550 B2 | 10/2006 | Kitano et al. |
| 7,129,935 B2 | 10/2006 | Mackey |
| 7,133,140 B2 | 11/2006 | Lukacs et al. |
| 7,133,793 B2 | 11/2006 | Ely et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,528 B2 | 12/2006 | Taylor et al. |
| 7,183,851 B2 | 2/2007 | Song |
| 7,208,959 B2 | 4/2007 | Horn et al. |
| 7,212,189 B2 | 5/2007 | Shaw et al |
| 7,235,983 B2 | 6/2007 | McCartney et al. |
| 7,253,643 B1 | 8/2007 | Seguine |
| 7,262,609 B2 | 8/2007 | Reynolds |
| 7,288,946 B2 | 10/2007 | Hargreaves et al. |
| 7,288,977 B2 | 10/2007 | Stanley |
| 7,298,124 B2 | 11/2007 | Kan Kwok et al. |
| 7,301,350 B2 | 11/2007 | Hargreaves et al. |
| 7,315,793 B2 | 1/2008 | Jean |
| 7,339,580 B2 | 3/2008 | Westerman et al. |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,449,895 B2 | 11/2008 | Ely et al. |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin et al. |
| 7,466,307 B2 | 12/2008 | Trent, Jr. et al. |
| 7,498,822 B2 | 3/2009 | Lee |
| 7,499,040 B2 | 3/2009 | Zadesky et al. |
| 7,521,941 B2 | 4/2009 | Ely et al. |
| 7,535,264 B2 | 5/2009 | Hiller et al. |
| 7,663,607 B2 | 2/2010 | Hotelling et al. |
| 7,683,641 B2 | 3/2010 | Hargreaves et al. |
| 7,724,001 B2 | 5/2010 | Kleven |
| 7,812,827 B2 | 10/2010 | Hotelling et al. |
| 7,825,688 B1 | 11/2010 | Snyder et al. |
| 7,884,621 B2 | 2/2011 | Snyder |
| 8,054,300 B2 | 11/2011 | Bernstein |
| 8,358,142 B2 | 1/2013 | Maharyta |
| 8,487,639 B1 * | 7/2013 | Walsh et al. .................. 324/679 |
| 2001/0008478 A1 | 7/2001 | Mcintosh et al. |
| 2001/0020850 A1 | 9/2001 | Mcintosh et al. |
| 2002/0063688 A1 | 5/2002 | Shaw et al. |
| 2002/0180464 A1 | 12/2002 | Tartagni |
| 2002/0191029 A1 | 12/2002 | Gillespie et al. |
| 2003/0062889 A1 | 4/2003 | Ely et al. |
| 2003/0080755 A1 | 5/2003 | Kobayashi |
| 2003/0090277 A1 | 5/2003 | Lechner et al. |
| 2004/0178989 A1 | 9/2004 | Shahoian et al. |
| 2005/0024341 A1 | 2/2005 | Gillespie et al. |
| 2005/0040833 A1 | 2/2005 | Yakabe et al. |
| 2005/0122119 A1 | 6/2005 | Barlow |
| 2006/0001490 A1 | 1/2006 | Song |
| 2006/0032680 A1 | 2/2006 | Elias et al. |
| 2006/0038793 A1 | 2/2006 | Philipp |
| 2006/0066582 A1 | 3/2006 | Lyon et al. |
| 2006/0071674 A1 | 4/2006 | Jean |
| 2006/0097991 A1 | 5/2006 | Hotelling et al. |
| 2006/0138574 A1 | 6/2006 | Saito et al. |
| 2006/0273804 A1 | 12/2006 | Delorme et al. |
| 2007/0227253 A1 | 10/2007 | Kleven |
| 2007/0257894 A1 | 11/2007 | Philipp |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0048997 A1 * | 2/2008 | Gillespie et al. .............. 345/174 |
| 2008/0068076 A1 | 3/2008 | Goodnow et al. |
| 2008/0085720 A1 | 4/2008 | Hirano et al. |
| 2008/0088602 A1 | 4/2008 | Hotelling |
| 2008/0111714 A1 | 5/2008 | Kremin |
| 2008/0116904 A1 | 5/2008 | Reynolds et al. |
| 2008/0128182 A1 | 6/2008 | Westerman et al. |
| 2008/0162996 A1 | 7/2008 | Krah et al. |
| 2008/0278178 A1 | 11/2008 | Philipp |
| 2009/0008161 A1 | 1/2009 | Jones et al. |
| 2009/0009491 A1 | 1/2009 | Grivna |
| 2009/0058802 A1 | 3/2009 | Orsley |
| 2009/0096757 A1 | 4/2009 | Hotelling et al. |
| 2009/0160461 A1 | 6/2009 | Zangl et al. |
| 2009/0194344 A1 | 8/2009 | Harley et al. |
| 2009/0224776 A1 | 9/2009 | Keith |
| 2009/0267622 A1 | 10/2009 | Hansen et al. |
| 2009/0273573 A1 | 11/2009 | Hotelling |
| 2009/0315258 A1 | 12/2009 | Wallace et al. |
| 2010/0060622 A1 | 3/2010 | Van Der et al. |
| 2010/0073323 A1 | 3/2010 | Geaghan |
| 2010/0110038 A1 | 5/2010 | Mo et al. |
| 2010/0201382 A1 | 8/2010 | Welland |
| 2010/0219846 A1 | 9/2010 | Dubery |
| 2011/0007021 A1 | 1/2011 | Bernstein et al. |
| 2011/0025629 A1 * | 2/2011 | Grivna et al. .................. 345/173 |
| 2012/0049868 A1 | 3/2012 | Maharyta |
| 2012/0256869 A1 | 10/2012 | Walsh et al. |

OTHER PUBLICATIONS

Lichun Shao, Palaniapan Moorthi, Wan Tan Woei, A continuous-time capacitance to voltage converter for microcapacitivepressure sen-

(56) References Cited

OTHER PUBLICATIONS sors, Journal of Physics: Conference Series 34 (2006) 1014-1019, 2006, 7 pg., London, UK.
Ryan Seguine, Capacitive Sensing Techniques and Considerations, Mobile Handset DesignLine, Nov. 2007, 7 pg., San Jose, CA.
Robert Jania, "Cypress' CapSense Successive Approximation Algorithm," Whiat Paper CSA RJO.doc, Jan. 17, 2007; 6 pages.
Ryan Seguine et al., "Layout Guidelines for PSoC CapSense", Cypress Application Note AN2292, Revision B, Oct. 31, 2005, pp. 1-15.
S. Minaei, "A New High Performance CMOS Third Generation Current Conveyor (CCII) and its Application," Electrical Engineering, vol. 85, No. 3, Springer-Verlag, Jul. 2003, pp. 147-153; 7 pages.
Salem et al., "A 2.5V 0.35um CMOS Current Conveyor and High Frequency High-Q Band-Pass Filter," The 16th International Conference on Microelectronics, Dec. 2004, pp. 328-333; 6 pages.
Sander L. J. Gierkink, "Control Linearity and Jitter of Relaxation Oscillators", http://doc.utwente.nl.
Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.
Sedra et al., "A Second Generation Current Conveyor and Its Application," IEEE Transactions on Circuit Theory, Feb. 1970, vol. 17, pp. 132-134; 3 pages.
Sedra et al., "Current Conveyor Theory and Practice," IEEE Proceedings (Part G), Chapter 3, Apr. 1990, pp. 93-126; 18 pages.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; pp. 1-10, Jul. 22, 2005; 13 pages.
Shah et al., "Cascadable Electronically Tunable Sito Current-Mode Active-Only Universal Filter," 2008; 6 pages.
SIPO Office Action for Application No. 201080013632.1 dated Aug. 1, 2013; 6 pages.
Smith et al., "The Current Conveyor—A New Circuit Building Block," Proceedings of the IEEE, Aug. 1968, pp. 1368-1369; 2 pages.
Soliman A. Mahmoud, "New Fully-Differential Cmos Second-Generation Current Conveyor," ETRI Journal, vol. 28, No. 4, Aug. 2006; pp. 495-501; 7 pages.
USPTO Final Rejection for U.S. Appl. No. 12/507,614 dated Jun. 21, 2011; 17 pages.
USPTO Final Rejection for U.S. Appl. No. 12/507,614 dated Oct. 29, 2013; 6 pages.
USPTO Final Rejection for U.S. Appl. No. 13/739,991 dated Jun. 21, 2013; 8 pages.
USPTO Non-Final Rejection for U.S. Appl. No. 11/600,255 dated Mar. 29, 2010; 10 pages.
USPTO Non-Final Rejection for U.S. Appl. No. 12/507,614 dated Jan. 31, 2011; 15 pages.
USPTO Non-Final Rejection for U.S. Appl. No. 12/507,614 dated Feb. 6, 2014; 6 pages.
USPTO Non-Final Rejection for U.S. Appl. No. 12/623,661 dated May 17, 2012; 13 pages.
USPTO Non-Final Rejection for U.S. Appl. No. 13/185,447 dated Nov. 15, 2013; 5 pages.
USPTO Non-Final Rejection for U.S. Appl. No. 13/297,171 dated Jul. 9, 2013; 8 pages.
USPTO Non-Final Rejection for U.S. Appl. No. 13/739,991 dated Apr. 26, 2013; 11 Pages.
USPTO Notice of Allowance for U.S. Appl. No. 11/489,944 dated Apr. 9, 2007; 7 pages.
USPTO Notice of Allowance for U.S. Appl. No. 11/489,944 dated May 24, 2007; 2 pages.
USPTO Notice of Allowance for U.S. Appl. No. 11/600,255 dated Jul. 27, 2010; 6 pages.
USPTO Notice of Allowance for U.S. Appl. No. 12/507,614 dated May 21, 2014; 7 pages.
USPTO Notice of Allowance for U.S. Appl. No. 12/507,614 dated Jul. 18, 2014; 7 pages.
USPTO Notice of Allowance for U.S. Appl. No. 12/623,661 dated Apr. 12, 2013; 9 pages.
USPTO Notice of Allowance for U.S. Appl. No. 12/623,661 dated May 29, 2013; 9 pages.
USPTO Notice of Allowance for U.S. Appl. No. 12/623,661 dated Aug. 30, 2012; 8 pages.
USPTO Notice of Allowance for U.S. Appl. No. 13/185,447 dated Mar. 10, 2014; 7 pages.
USPTO Notice of Allowance for U.S. Appl. No. 13/739,991 dated Jul. 22, 2013; 6 pages.
USPTO Notice of Allowance for U.S. Appl. No. 13/739,991 dated Sep. 4, 2013; 6 pages.
USPTO Requirement for Restriction for U.S. Appl. No. 12/507,614 dated Feb. 27, 2013; 12 pages.
USPTO Requirement for Restriction for U.S. Appl. No. 13/185,447 dated Oct. 10, 2013; 8 Pages.
Van Ess, D., "Understanding Switched Capacitor Analog Blocs," AN2041, Application Note, Mar. 30, 2004, 16 pages.
Van Ess, David; "Simulating a 555 Timer with PSoC," Cypress Semiconductor Corporation, Application Note AN2286, May 19, 2005; 10 pages.
Vladislav Golub, Ph.D., "Sigma-Delta ADCs", pub. date: Jun. 17, 2003, 10 pages.
Written Opinion of the International Searching Authority for International Application No. PCT/US 11/67153 mailed Apr. 24, 2012; 9 pages.
Written Opinion of the International Searching Authority for International Application No. PCT/US10/28943 mailed on Sep. 7, 2010; 5 pages.
"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.
A. Fabre, "Third-Generation Current Conveyor: a New Helpful Active Element," Electronics Letters, vol. 31, No. 5, Mar. 1995, pp. 338-339; 2 pages.
Adisak Monopapassorn, "CMOS High Frequency/Low Voltage Full-Wave Rectifier," Thammasat International Journal of Science and Technology, vol. 8, No. 2, Apr.-Jun. 2003; 11 pages.
Ahmed M. Soliman, "Generation of Current Conveyor-Based All-Pass Filters from Op Amp-Based Circuits," IEEE Transactions on Circuits and Systems II: Analog and Digital Signal Processing, vol. 44, No. 4, Apr. 1997, pp. 324-330; 7 pages.
U.S. Appl. No. 12/507,614: "Multi-Functional Capacitance Sensing Circuit With a Current Conveyor," Viktor Kremin, filed Jul. 22, 2009; 56 pages.
U.S. Appl. No. 12/623,661: "Receive Demodulator for Capacitive Sensnig" Paul Walsh et al., filed Nov. 23, 2009; 48 pages.
U.S. Appl. No. 13/185,447: "Capacitance Sensing Systems, Circuits and Methods That Include Current Conveyor Based Oscillators," Andriy Maharyta, filed Jul. 18, 2011; 58 pages.
U.S. Appl. No. 14/071,107: "Receive Demodulator for Capacitive Sensing" Paul M. Walsh et al., filed Nov. 4, 2013; 40 pages.
Assi et al., "An Offset Compensated and High-Gain Cmos Current-Feedback Op-Amp," IEEE Transactions on Circuits and Systems I: Fundamental Theory and Applications, vol. 45, No. 1, Jan. 1998, pp. 85-90; 6 pages.
Calvo et al., "Novel High Performance CMOS Current Conveyor," Microelectronics Reliability, Mar. 2003, pp. 955-961; 7 pages.
Cataldo et al., "Active Capacitance Multipliers Using Current Conveyors," Proceedings of the 1998 IEEE International Symposium on Circuits and Systems, vol. 2, Jun. 1998, pp. 343-346; 4 pages.
Chapweske, Adam; "The PS/2 Mouse Interface," PS/2 Mouse Interfacing, 2001, retrieved on May 18, 2006; 10 pages.
Christopher Ard and Dr. Gaute Myklebust, "Product How-To: Advanced Touch Interface Drivers Enable New User Applications",http://www.eetimes.com/design/analog-design/4008306/Product-How-To-Advanced-Touch-Interface-Drivers-Enable-New-User-Applications.
CSD User Module Data Sheet, Cypress Semiconductor Corporation CSD v 1.0, Oct. 23, 2006; 58 pages.

(56) References Cited

OTHER PUBLICATIONS

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "Release Notes srn017," Jan. 24, 2007; 3 pages.

Dennis Seguine, "Capacitive Switch Scan," Cypress Application Note AN2233a, Revision B, Apr. 14, 2005; 6 pages.

Elwan et al., "Low-Voltage Low-Power CMOS Current Conveyors," IEEE Transactions on Circuits and System I: Fundamental Theory and Applications, vol. 44, No. 9, Sep. 1997; pp. 828-835; 8 pages.

Ibrahim et al., "A CMOS Realization of Inverting Second Generation Current Conveyor 'Positive' (ICCII+)," The Norwegian Signal Processing Society and IEEE 5th Nordic Signal Processing Symposium, Oct. 2002; 4 pages.

Ibrahime et al., "A New Voltage Scaling Type Digital-Analog Converter Using Only DDCCS," 3rd International Conference on Electrical and Electronics Engineering, 2003; 4 pages.

Imazeki et al., "Low-Voltage, Low-Power, Second-Generation Current Conveyors," Electrical Engineering in Japan, vol. 138, No. 2, Nov. 2001, pp. 41-48; 8 pages.

International Search Report and Written Opinion for Application No. PCT/US11/67153 dated Apr. 24, 2012; 8 pages.

International Search Report for International Application No. PCT/US10/28943 mailed on Sep. 7, 2010; 2 pages.

James Quan, "CMOS Programmable Gain Circuits: Amplifiers and Current Conveyors," The University of Calgary, Aug. 2005; 141 pages.

Kayed et al., "VLSI Design and Implementation of CMOS Current Conveyors," The Eleventh International Conference on Microelectronics, Nov. 1999, pp. 55-57; 3 pages.

Kimmo Koli, "CMOS Current Amplifiers: Speed versus Nonlinearity," Dissertation, Nov. 2000; 305 pages.

L. Grigorescu, "Amplifiers Built with Current-Conveyors," Sep. 2006, pp. 105-109; 5 pages.

Lee, Mark; "EMC Design Considerations for PSoC CapSense Applications," Cypress Semiconductor Corporation, Application Note AN2318; Sep. 16, 2005; 6 pages.

Madian et al., "New 1.5-V CMOS Second Generation Current Conveyor Based on Wide Range Transconductor," Analog Integrated Circuits and Signal Processing, Springer Netherlands, Sep. 2006, pp. 267-279; 13 pages.

Mahmoud et al., "Low-Voltage CMOS Current Feedback Operational Amplifier and Its Application," ETRI Journal, vol. 29, No. 2, Apr. 2007, pp. 212-218; 7 pages.

Maitreechit et al., "A Full-Wave Rectifier Using a Current Conveyor and Current Mirrors with Improved Efficiency," Thammasat International Journal of Science and Technology, vol. 10, No. 2, Apr.-Jun. 2005, pp. 21-27; 7 pages.

Mark Lee, "CapSense Best Practice", Cypress Application Note AN2394, Rev. **, Oct. 19, 2006, pp. 1-10.

Mark Lee, The Art of Capacitive Touch Sensing, Cypress Perform, Published in Embedded.com (http://www.embedded.com); 10 pages.

Masciotti et al., "CMOS Current-Mode Analog Circuit Building Blocks for RF DC-DC Converter Controllers," Proceedings of the 2003 International Symposium on Circuits and Systems, May 2003, vol. 3, pp. 455-458; 4 pages.

Maundy et al., "A New Configuration for Current Feedback Operational Amplifiers," The 2002 45th Midwest Symposium on Circuits and Systems, vol. 1, Aug. 2002, pp. 547-550; 4 pages.

Minaei et al., "High Performance CMOS Realization of the Third Generation Current Conveyor (CCII)," MWSCAS, 2002, 16 pages.

Mohit Kumar, "Low-Voltage Current-Mode Analog Cells," M. Tech. Credit Seminar Report, Electronic Systems Group, Nov. 2002, 16 pages.

Montree Siripruchyanun, "Second Generation Current Conveyor (CCII)," PowerPoint Presentation, Jan. 2008; 29 pages.

Pawarangkoon et al., "Four-Quadrant Current-Mode Divider Based on Current Conveyors," IEEE Region 10 Conference TENCON, Nov. 2004, vol. 4, pp. 380-383; 4 pages.

Premont et al., "Current-Conveyor Based Field Programmable Analog Array," Analog Integrated Circuits and Signal Processing, Sep. 1998, vol. 17, pp. 155-157; 3 pages.

U.S. Appl. No. 61/117,031: "Rx Demodulator for CapSense Using a Quasi Differential Channel," Paul Walsh, filed Nov. 21, 2008; 42 pages.

U.S. Appl. No. 61/163,531: "Multifunctional Capacitance Sensing Front-end Circuit with Current Conveyor," Viktor Kremin, filed Mar. 26, 2009; 18 pages.

U.S. Appl. No. 61/376,460: "Mutual Capacitance Sensing Using First Order Relaxation Oscillators," Victor Kremin, filed Aug. 24, 2010; 17 pages.

U.S. Appl. No. 61/472,161: "Signal Receipt for a TXRX Capacitance Sensing Panel," Hans Klein, filed Apr. 5, 2011; 12 pages.

Rajpiit et al., "Low Voltage, Low Power, High Performance Current Conveyors," The 2001 IEEE International Symposium on Circuits and Systems, May 2001, vol. 1, pp. 723-726; 4 pages.

Rajput et al., "Advanced Applications of Current Conveyors: A Tutorial," J. of Active and Passive Electronic Devices, vol. 2, 2007, Old City Publishing Inc., pp. 143-164; 22 pages.

* cited by examiner

ACTIVE INTEGRATOR FOR A CAPACITIVE SENSE ARRAY

RELATED APPLICATIONS

This application claims the benefit of U.S. Provisional Patent Application No. 61/472,161 filed Apr. 5, 2011, the disclosure of which is incorporated herein by reference in its entirety.

TECHNICAL FIELD

The present invention relates generally to capacitive touch sense arrays, and more particularly, to an active integrator receiving circuit for a touch sense array.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor elements that detect the position of one or more conductive objects, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

A certain class of touch sense arrays includes a first set of linear electrodes separated from a second set of electrodes arranged at right angles and separated by a dielectric layer. The resulting intersections form a two-dimensional array of capacitors, referred to as sense elements. Touch sense arrays can be scanned in several ways, one of which (mutual-capacitance sensing) permits individual capacitive elements to be measured. Another method (self-capacitance sensing) can measure an entire sensor strip, or even an entire sensor array, with less information about a specific location, but performed with a single read operation.

The two-dimensional array of capacitors, when placed in close proximity, provides a means for sensing touch. A conductive object, such as a finger or a stylus, coming in close proximity to the touch sense array causes changes in the total capacitances of the sense elements in proximity to the conductive object. These changes in capacitance can be measured to produce a "two-dimensional map" that indicates where the touch on the array has occurred.

One way to measure such capacitance changes is to form a circuit comprising a signal driver (e.g., an AC current or a voltage source ("transmit" (TX) signal)) which is applied to each horizontally aligned conductor in a multiplexed fashion. The charge accumulated on each of the capacitive intersections are sensed and similarly scanned at each of the vertically aligned electrodes in synchronization with the applied current/voltage source. This charge is then measured, typically with a form of charge-to-voltage converter (i.e., receive or "RX" signal), which is sampled-and-held for an A/D converter to convert to digital form for input to a processor. The processor, in turn, renders the capacitive map and determines the location of a touch.

Conventional capacitive sensing receiving circuits suffer from a number of deficiencies. Changes in capacitance, as a result of a touch by a conductive object, are generally small. As a result, much of the voltage appearing at the ADC is representative of the baseline capacitance of the sense elements of the array, which results in a large DC component. Capacitance changes due to touch may account for only 1% of the baseline capacitance. Further, noise from various sources may couple into the signal path, further complicating accurate capacitance change measurements and resulting in a low signal-to-noise (SNR) ratio.

BRIEF DESCRIPTION OF THE DRAWINGS

Embodiments of the present invention will be more readily understood from the detailed description of exemplary embodiments presented below considered in conjunction with the attached drawings in which like reference numerals refer to similar elements and in which.

DETAILED DESCRIPTION

Embodiments of the invention provide an active integrator configured to measure a capacitance of a touch sense array or part of an array (e.g., a single strip). The active integrator is configured to receive from the touch sense array a response signal representative of a presence or an absence of a conductive object on the touch sense array. The response signal is generally assumed to be supplied from a touch sense array, which is driven by an AC current/voltage source. As a result, the response signal includes a positive portion and a negative portion. The embodiments described herein employ the active integrator and supporting circuitry to continuously integrate the response signal. This continuous integration property is primarily a result of the switch-capacitance nature of the active integrator. One possible advantage of employing a switched-capacitive active integrator may be an improved SNR over conventional designs. In one embodiment, when the frequency of switching matches the fundamental frequency and phase of the response signal, an output signal has a narrow pass-band centered about a fundamental frequency of the response signal, resulting in a substantially improved SNR. This method is also referred to as full-wave demodulation.

In one embodiment, the active integrator includes an operational amplifier (opamp) coupled to a pair of feedback capacitors. One feedback capacitor is configured to store a charge responsive to the positive portion of the response signal, and a second feedback capacitor is configured to store a charge responsive to the negative portion of the response signal. The first feedback capacitor and the second feedback capacitor may be configured to be variable to permit sensitivity calibration of the touch sense receivers. In one embodiment, the active integrator is coupled to a sample-and-hold (S/H) circuit configured to full-wave demodulate the output signal of the active integrator by means of a one or more switches. A first capacitor is configured to hold a positive signal on the output terminal of the active integrator when the positive portion of the response signal is present, and a second capacitor is configured to hold a negative signal on the output terminal of the active integrator when the negative portion of the response signal is present.

Figure 1:
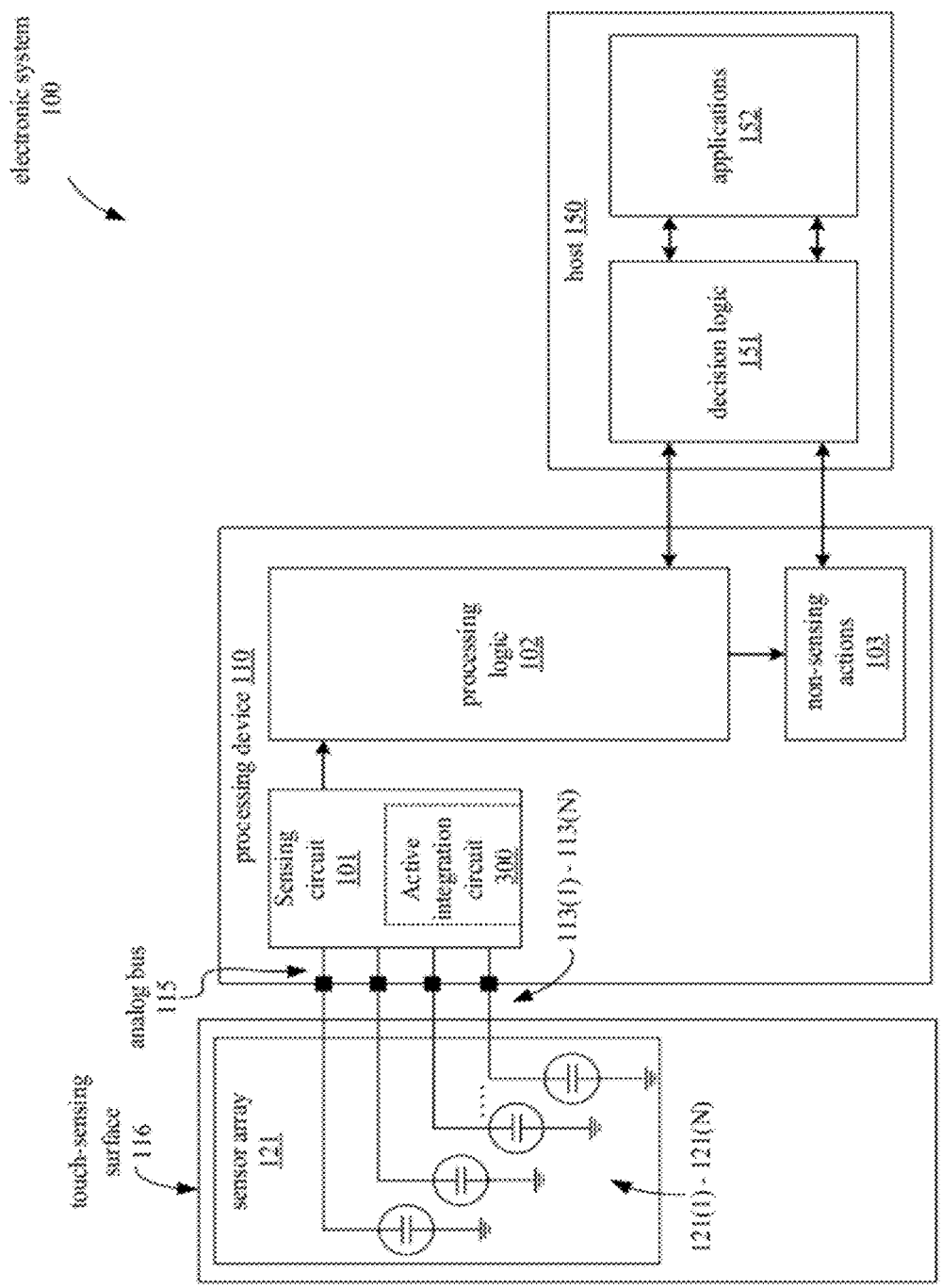
FIG. 1 illustrates a block diagram of one embodiment of an electronic system including a processing device that may be configured to measure capacitances from a flexible touch-sensing surface and calculate or detect the amount of force applied to the flexible touch-sensing surface.

FIG. 1 illustrates a block diagram of one embodiment of an electronic system 100 including a processing device 110 that may be configured to measure capacitances from a flexible touch-sensing surface and calculate or detect the amount of force applied to the flexible touch-sensing surface. The electronic system 100 includes a touch-sensing surface 116 (e.g., a touch screen, or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor elements 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor element 121(1)-121(N) is represented as a capacitor. The self capacitance of each sensor in the sensor array 121 is measured by a sensing circuit 101 in the processing device 110.

In one embodiment, the sensing circuit 101 may include a relaxation oscillator or other means to convert a capacitance into a measured value. The sensing circuit 101 may also include a counter or timer to measure the oscillator output. The sensing circuit 101 may further include software components to convert the count value (e.g., capacitance value) into a sensor element detection decision (also referred to as switch detection decision) or relative magnitude. In another embodiment, the sensing circuit 101 includes an active integration circuit 300 to be described below.

It should be noted that there are various known methods for measuring capacitance, such as current or voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the sensing circuit 101 via processing logic 102 may be evaluating other measurements to determine the user interaction. For example, in the sensing circuit 101 having a sigma-delta modulator, the processing logic 102 is evaluating the ratio of pulse widths of the output, instead of the raw counts being over or under a certain threshold.

In one embodiment, the processing device 110 further includes the processing logic 102. Operations of the processing logic 102 may be implemented in firmware; alternatively, it may be implemented in hardware or software. The processing logic 102 may receive signals from the sensing circuit 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as gesture interpretation. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
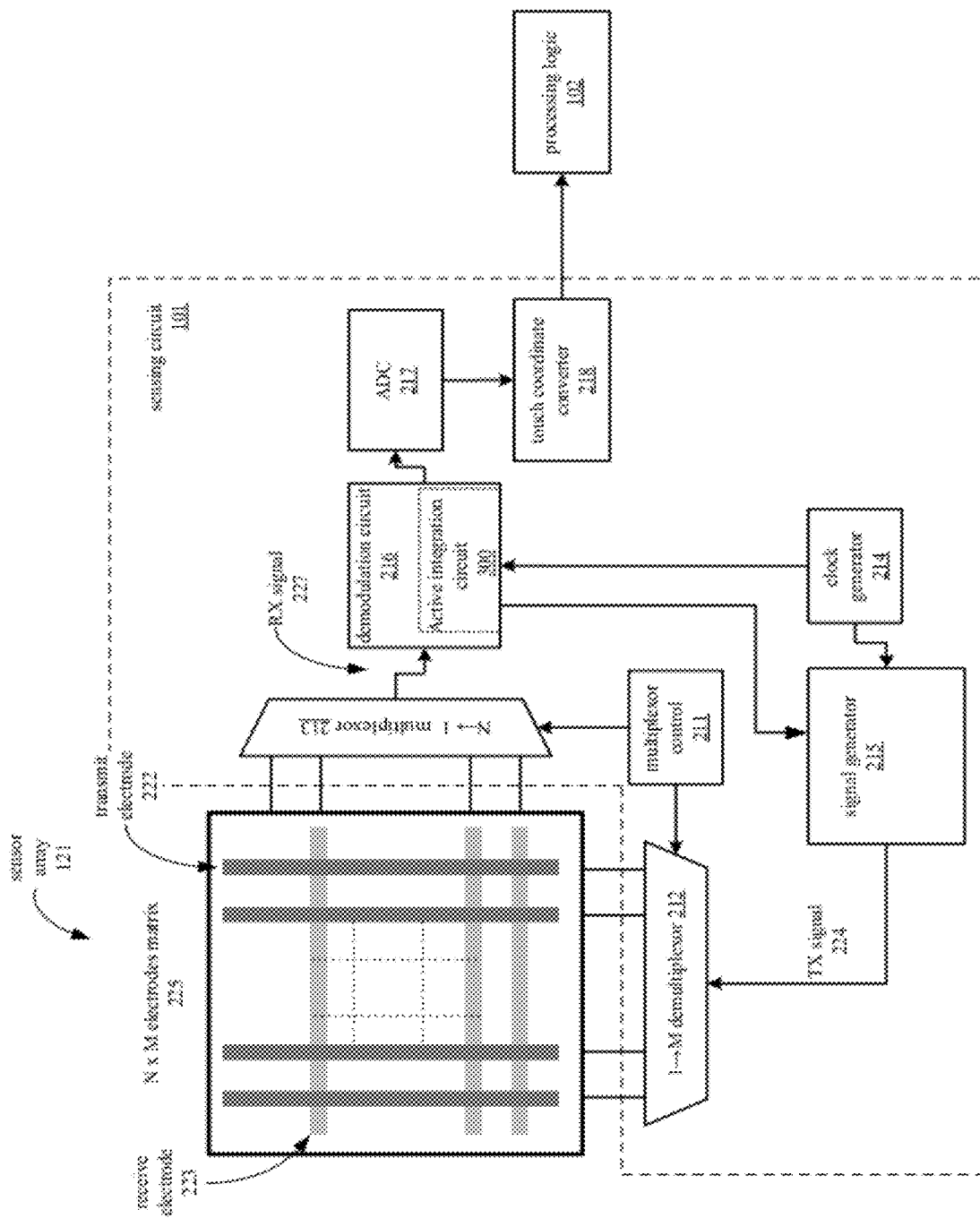
FIG. 2 is a block diagram illustrating one embodiment of a capacitive touch sensor array and a capacitance sensor that converts measured capacitances to coordinates.

FIG. 2 is a block diagram illustrating one embodiment of a capacitive touch sensor array 121 and a sensing circuit 101 that converts measured capacitances to coordinates. The coordinates are calculated based on measured capacitances. In one embodiment, sensor array 121 and sensing circuit 101 are implemented in a system such as electronic system 100. Sensor array 121 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Sensing circuit 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 outputs a signal to the processing logic 102.

In one embodiment, processing logic 102 may be a processing core 102. The processing core may reside on a common carrier substrate such as, for example, an integrated circuit ("IC") die substrate, a multi-chip module substrate, or the like. Alternatively, the components of processing core 102 may be one or more separate integrated circuits and/or discrete components. In one exemplary embodiment, processing core 102 is configured to provide intelligent control for the Programmable System on a Chip ("PSoC®") processing device, manufactured by Cypress Semiconductor Corporation, San Jose, Calif. Alternatively, processing core 102 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like. In one embodiment, the processing core 102 and the other components of the processing device 110 are integrated into the same integrated circuit.

It should also be noted that the embodiments described herein are not limited to having a configuration of a processing core 102 coupled to a host 150, but may include a system that measures the capacitance on the touch sense array 121 and sends the raw data to a host computer where it is analyzed by an application. In effect, the processing that is done by processing core 102 may also be done in the host. The host may be a microprocessor, for example, as well as other types of processing devices as would be appreciated by one of ordinary skill in the art having the benefit of this disclosure.

The components of the electronic system 100 excluding the touch sense array 121 may be integrated into the IC of the processing core 102, or alternatively, in a separate IC. Alternatively, descriptions of the electronic system 100 may be generated and compiled for incorporation into other integrated circuits. For example, behavioral level code describing the electronic system 100, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe the electronic system 100.

It should be noted that the components of the electronic system 100 may include all the components described above. Alternatively, the electronic system 100 may include only some of the components described above.

In one embodiment, the electronic system 100 is used in a notebook computer. Alternatively, the electronic device may be used in other applications, such as a mobile handset, a personal data assistant ("PDA"), a keyboard, a television, a remote control, a monitor, a handheld multi-media device, a handheld video player, a handheld gaming device, or a control panel.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sense array 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different. In another embodiment, the active integration circuit 300 is coupled to the signal generator 215 to be described below. A person of ordinary skill in the art would appreciate that the signal generator 215 may supply a TX signal 224 that may be any periodic signal having a positive portion and a negative portion, including, for example, a sine wave, a square wave, a triangle wave, etc.

The output of signal generator 215 is connected with demultiplexer 212, which allows the TX signal 224 to be applied to any of the M transmit electrodes of touch sense array 121. In one embodiment, multiplexer control 211 controls demultiplexer 212 so that the TX signal 224 is applied to each transmit electrode 222 in a controlled sequence. In another embodiment, the TX signal 224 is applied to one or more transmit electrodes 222 simultaneously in what may be termed as a multi-phase TX mode. Demultiplexer 212 may also be used to ground, float, or connect an alternate signal to the other transmit electrodes to which the TX signal 224 is not currently being applied.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a decrease in the mutual capacitance between only some of the electrodes. For example, if a finger is placed near the intersection of transmit electrode 222 and receive electrode 223, the presence of the finger will decrease the mutual capacitance between electrodes 222 and 223. Thus, the location of the finger on the touchpad can be determined by identifying the one or more receive electrodes having a decreased mutual capacitance in addition to identifying the transmit electrode to which the TX signal 224 was applied at the time the decreased mutual capacitance was measured on the one or more receive electrodes.

By determining the mutual capacitances associated with each intersection of electrodes in the matrix 225, the locations of one or more touch contacts may be determined. The determination may be sequential, in parallel, or may occur more frequently at commonly used electrodes.

In alternative embodiments, other methods for detecting the presence of a finger or conductive object may be used where the finger or conductive object causes an increase in capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined from the locations of one or more electrodes at which an increased capacitance is detected.

The induced current signal 227 is rectified by demodulation circuit 216. The rectified current output by demodulation circuit 216 can then be filtered and converted to a digital code by ADC 217. In an embodiment, the demodulation circuit may include an active integration circuit 300 to be described below.

The digital code is converted to touch coordinates indicating a position of an input on touch sensor array 121 by touch coordinate converter 218. The touch coordinates are transmitted as an input signal to the processing logic 102. In one embodiment, the input signal is received at an input to the processing logic 102. In one embodiment, the input may be configured to receive capacitance measurements indicating a plurality of row coordinates and a plurality of column coordinates. Alternatively, the input may be configured to receive row coordinates and column coordinates.

In one embodiment, a system for tracking locations of contacts on a touch-sensing surface may determine a force magnitude for each of the contacts based on the capacitance measurements from the capacitive sensor array. In one embodiment, a capacitive touch-sensing system that is also capable of determining a magnitude of force applied to each of a plurality of contacts at a touch-sensing surface may be constructed from flexible materials, such as PMMA, and may have no shield between the capacitive sensor array and an LCD display panel. In such an embodiment, changes in capacitances of sensor elements may be caused by the displacement of the sensor elements closer to a VCOM plane of the LCD display panel.

Figure 3:
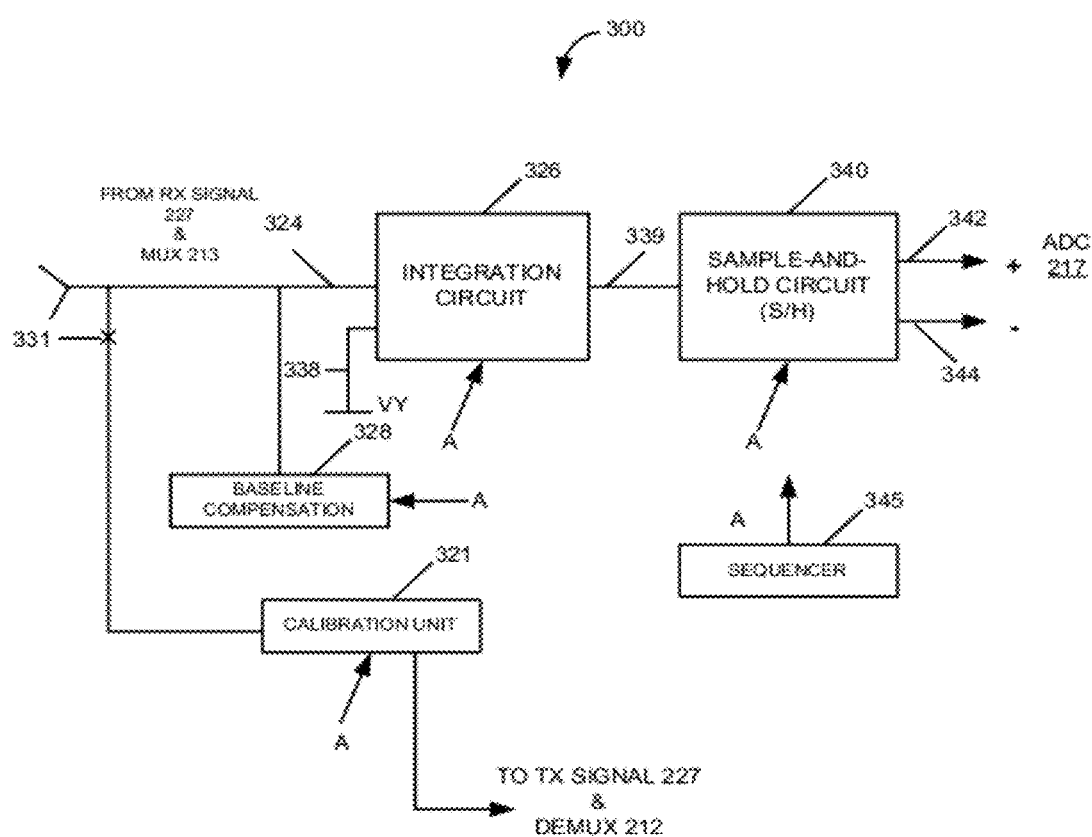
FIG. 3 depicts an electrical block diagram of one embodiment of an active integration circuit configured to receive an RX signal from receive electrodes to measure a capacitance of the touch sense array of FIG. 2.

FIG. 3 depicts an electrical block diagram of one embodiment of the active integration circuit 300 configured to receive the RX signal 227 from the receive electrodes to measure a capacitance of the touch sense array 121 or part of an array (e.g., a single strip) of FIG. 2. The active integration circuit 300 includes a calibration unit 321, an active integrator 326, a sample-and-hold (S/H) circuit 340, and a sequencer circuit 345. The multiplexer 213 of FIG. 2 is coupled to a first input 324 of an active integrator 326. A baseline compensation circuit 328 is coupled via one or more switches 330 to the first input 324 of an active integrator 326. A virtual-ground VY is coupled to a second input 338 of the active integrator 326. An output 339 of the active integrator 326 is coupled to a sample-and-hold (S/H) circuit 340. The S/H circuit 340 is differentially coupled to the ADC 217, via first and second outputs 342, 344. A central control circuit, referred to hereinafter as the sequencer circuit 345, has full control over all switches and activities in general in an entire touch-screen subsystem (TSS), including the active integration circuit 300 (as indicated by reference "A") to be described below in connection with FIGS. 3, 6A, 6B and 8. The calibration unit 321 provides a self-calibration of the sensing circuit 101 and is coupled to both the RX signal 227 and multiplexor 213 via one or more switches 331 and to the TX signal 227 and the demultiplexor 212 via one or more switches (not shown) to be described below in connection with FIG. 10.

Figure 4:
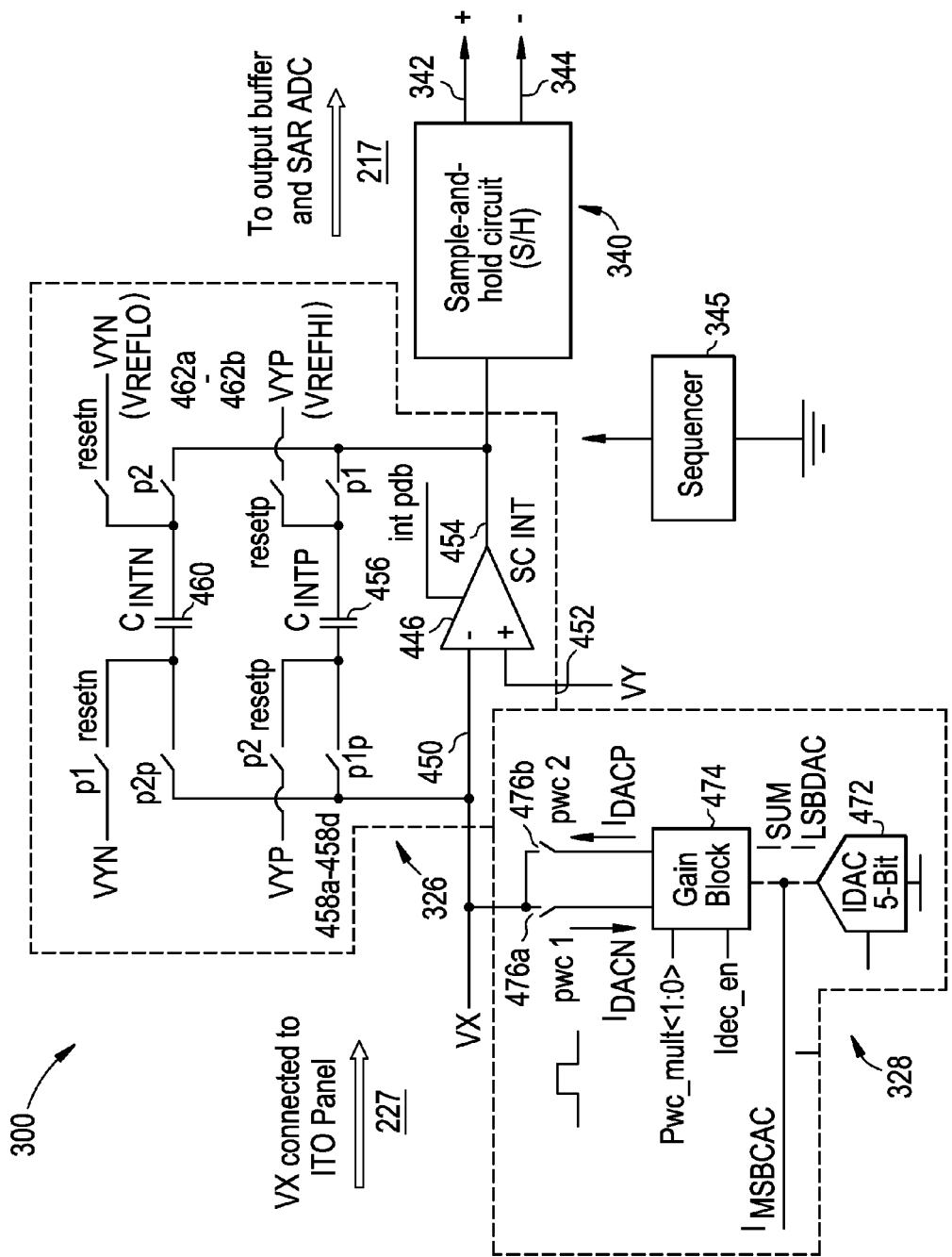
FIG. 4 is a block diagram of the components of an active integrator, a baseline compensation circuit, and a sample-and-hold (S/H) circuit employed in the active integration circuit of FIG. 3, according to an embodiment.

FIG. 4 is a block diagram of the components of the active integrator 326, the baseline compensation circuit 328, and the S/H circuit 340 employed in the active integration circuit 300 of FIG. 3. In an embodiment, the active integrator 326 may be a switched capacitor integrator including an operational amplifier 446 having a negative input terminal 450, a positive input terminal 452, and an output terminal 454. A first integrating capacitor 456, also labeled $C_{INTP}$, is coupled between the output terminal 454 and the negative input terminal 450 via a switches 458a-458d. A second integrating capacitor 460, also labeled $C_{INTN}$, is coupled between the output terminal 454 and the negative input terminal 450 via a plurality of switches 462a-462d.

Figure 5:
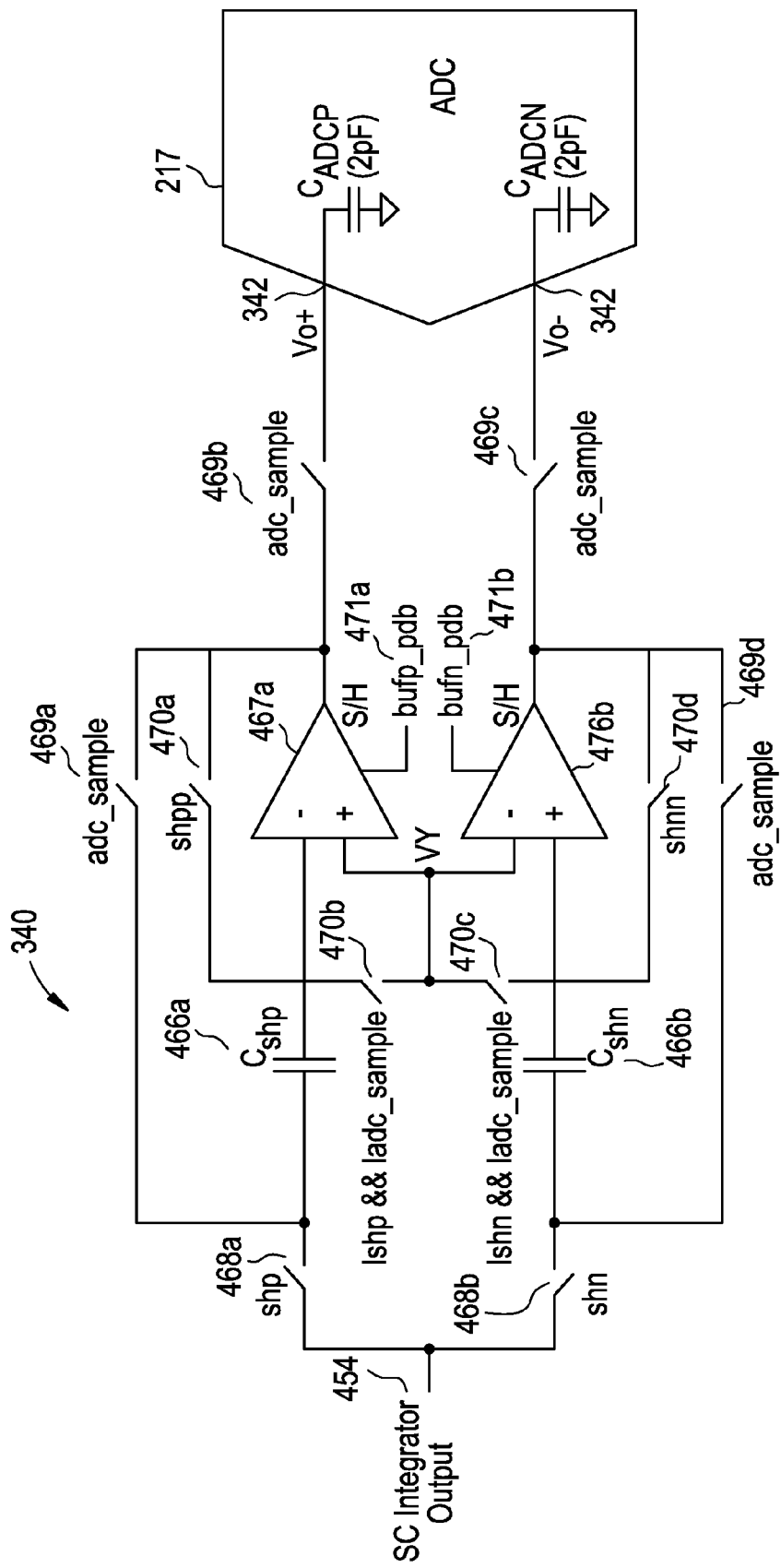
FIG. 5 is a schematic diagram of the components of one embodiment of the S/H circuit employed in the active integration circuit of FIGS. 3 and 4.

FIG. 5 is a schematic diagram of the components of one embodiment of the S/H circuit 340 employed in the active integration circuit 300 of FIGS. 3 and 4. In one embodiment, the S/H circuit 340 comprises a first S/H capacitor 466a, also labeled $C_{SHP}$, coupled or decoupled between an input terminal of an S/H buffer 467a and the output terminal 454 of the operational amplifier 446 via a switch 468a, also labeled "shp". The S/H circuit 340 also comprises a second S/H capacitor 466b, also labeled $C_{SHN}$, coupled or decoupled between an input terminal of an S/H buffer 467b and the output terminal 454 of the operational amplifier 446 via a switch 468b, also labeled "shn". Output terminals of the S/H buffer 467a, 467b and the S/H buffers themselves are couple or decoupled to a positive input 342 and negative input 344 of a differential ADC 217 via switches 469a-469d labeled "adc_sample." A plurality of switches 470a-470d, labeled "shpp", "shnn", "!shp && !adc_sample", and "!shn && !adc_sample" configure the S/H buffers for purposes to be described below. Inputs 471a, 471b labeled "bufp_pdb" and "bufn_pdb" to the S/H buffers 467a, 467b, respectively are employed to power up or power down each of the S/H buffers 467a, 467b for purposes to be described below Referring to FIGS. 3-5, the sequencer 345 has full control over all switches and activities in general in an entire touch-screen subsystem (TSS). This includes activating TX signals applied to the touch sense array 121 (e.g., going high or going low), switches in the active integrator 326 (e.g., p1, p2, p1p, p2p), baseline control switches pwc1/pwc2, IDAC values, the S/H circuit 340, and so forth. Using the sequencer 345, all activities in the RX and TX circuits occur in a fully synchronous fashion to be described below in connection with FIG. 7. The sequencer circuit 345 is implemented as part of the PSoC® processing device comprised of custom universal digital blocks (UDB) configured to provide timing for all switches in the active integrator 326 according to the timing diagrams of FIGS. 6A and 6B. As used herein, UDBs are a collection of uncommitted logic (PLD) and structural logic (Datapath) optimized to create all common embedded peripherals and customized functionality that are application or design specific. UDBs may be employed to implement a variety of general and specific digital logic devices including, but not limited to, field programmable gate arrays (FPGA), programmable array logic (PAL), complex programmable logic devices (CPLD) etc.

In the depicted embodiment of FIG. 4, the baseline compensation circuit 328 includes a current-output digital-to-analog converter (IDAC) 472 coupled between ground and a gain block 474. The gain block 474 is coupled to the input negative input terminal 450 of the operational amplifier 446 by a pair of switches 476a-476b, also labeled pwc1 and pwc2, respectively. The switch 476a (pwc1) is configured to apply a negative current $I_{DACN}$ to the negative input terminal 450 of the operational amplifier 446 to cancel a positive baseline charge originating from the response signal present on an output of the touch sense array 121 via operation of pwc1. Likewise, the switch 476b (pwc2) is configured to apply a positive current $I_{DACP}$ to the negative input terminal 450 of the operational amplifier 446 to cancel a negative baseline charge originating from the response signal present on an output of the touch sense array 121 via operation of pwc2.

In one embodiment, the baseline compensation circuit 328 serves to minimize the baseline offset of the response signal appearing at the differential inputs of the ADC 217 so as to maximize the number of output bits that are representative of a change in capacitance due to the approach of the touch sense array 121 of a conductive object. As a result, the dynamic range of the sensing circuit 101 may be improved.

Tolerances associated with the design and manufacturing of the sensor panel can make the baseline capacitance of some sensor elements vary significantly, even within a single touch sense array 121. This can further reduce the dynamic range of the ADC 217, because a fixed charge from any sense line is simply a baseline charge carrying no information about a touch event. Thus, instead of using a single, fixed value in the baseline compensation circuit (i.e., the IDAC 472), the value can be programmed in real-time to compensate for the actual baseline charge for the sense line currently sensed. The best setting can be determined in a "self-tuning" routine either at manufacturing time for the entire touch subsystem, or during power-up in the final end product.

Figure 6A:
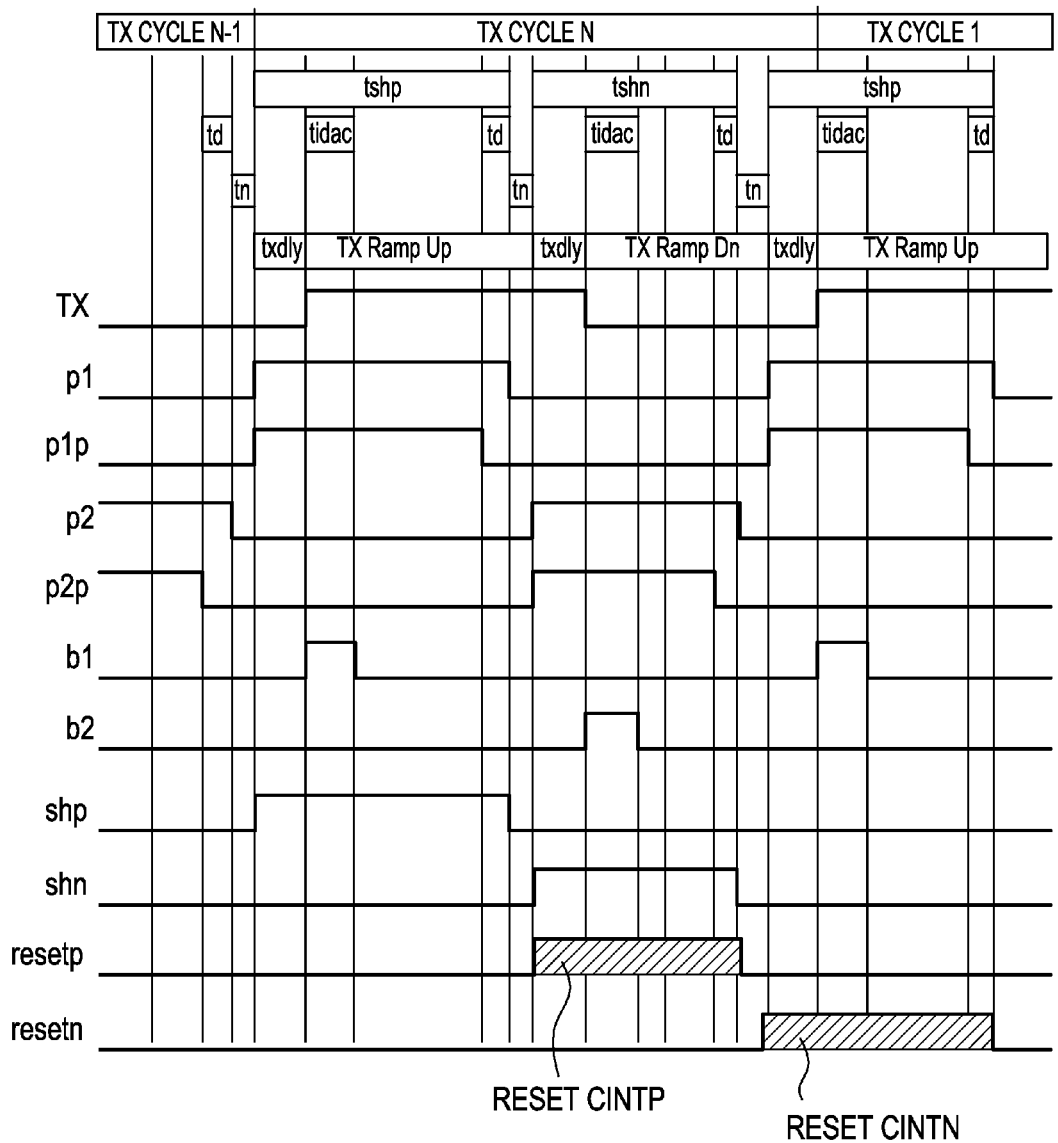
FIGS. 6A and 6B are diagrams illustrating one embodiment of the relative timing of the operation and presence of the various switches and signals associated with the active integrator of FIG. 4 and the S/H circuit of FIG. 5, respectively.
Figure 6B:
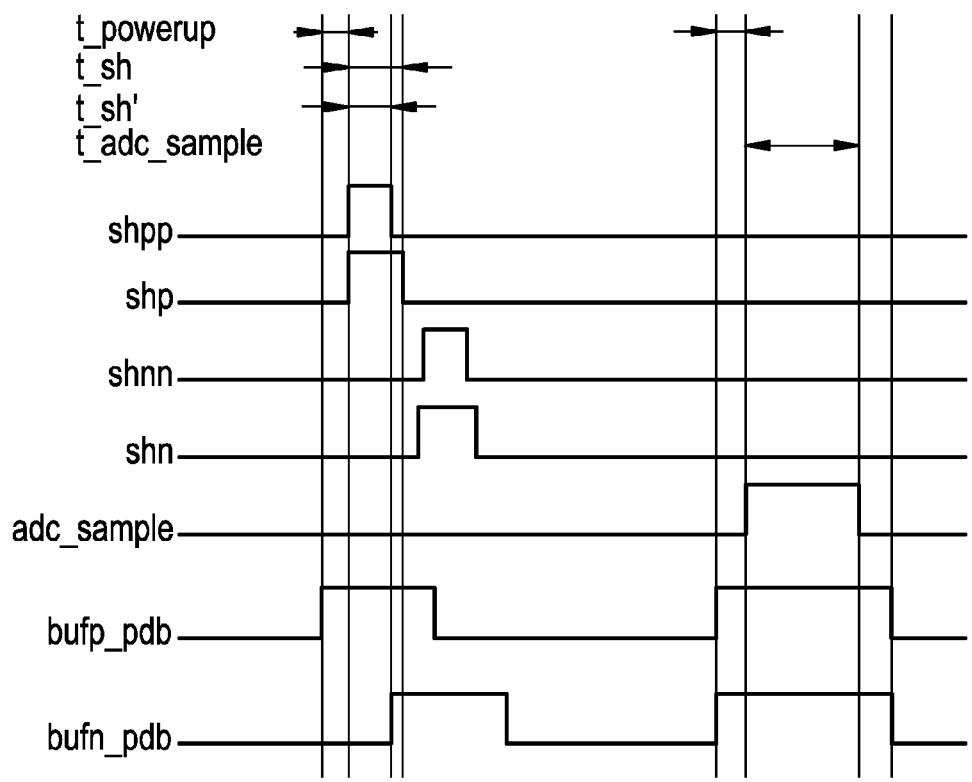

FIGS. 6A and 6B are diagrams illustrating one embodiment of the relative timing of the operation and presence of the various switches and signals associated with the active integrator 326 of FIG. 4 and the S/H circuit 340 of FIG. 5, respectively. The switches 458a-458d, 462a-462d coupled to the active integrator 326 and the switches 468a, 468b, 469a-469d, and 470a-470d coupled to the S/H circuit 340 are timed to continuously integrate a positive portion and a negative portion of a response signal continuously with substantially no "dead times." As soon as a negative portion of the response signal has been integrated, there is virtually no delay in switching over to the capacitor $C_{INTP}$ before a positive portion of the response signal may be integrate on the capacitor $C_{INTP}$. Moreover, as soon as a positive or negative signal has been integrated, the integrated signal may be impressed on $C_{SHP}$ and then $C_{SHN}$ via the switches 468a, 468b, 469a-469d, and 470a-470d coupled to the S/H circuit 340, respectively. The "differential" outputs of the S/H circuit 340 thus are configured to full-wave rectify an incoming integrated response signal, such that the same polarity of incoming signal is always presented to the differential inputs 342, 344 of the ADC 217.

Figure 7:
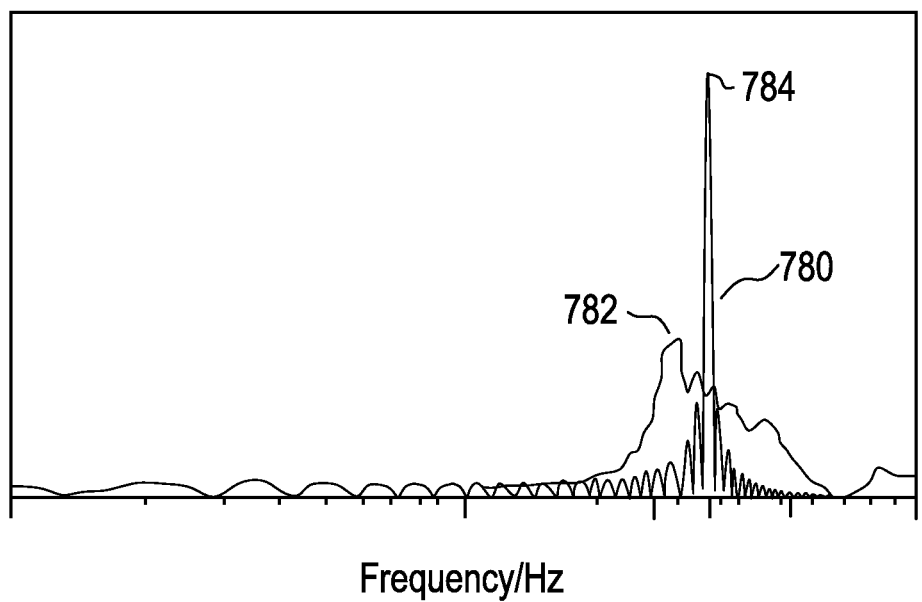
FIG. 7 is a graph of one embodiment of the spectral response of the response channel of the capacitance sensor of the touch sense array of FIG. 1 employing the components of FIGS. 4 and 5.

FIG. 7 is a graph of one embodiment of the spectral response of the response channel of the sensing circuit 101 of the touch sense array 121 of FIG. 1 employing the components of FIGS. 4 and 5. Since the active integrator 326 may substantially simultaneously drive the S/H circuit 340 while integrating, and one of the capacitors 456, 460 may be held or reset while the other is integrating continuously with substantially no dead time, the resulting channel has a narrow band frequency response 780 compared to a channel that integrates using a single capacitor and non-time/polarity coordinated S/H circuit 340, its response 782 shown also in FIG. 7. The narrow band frequency response has a peak 784 that corresponds to the fundamental frequency of the input signal (i.e., TX signal 224). As a result, the SNR is significantly improved compared to conventional designs.

Figure 8:
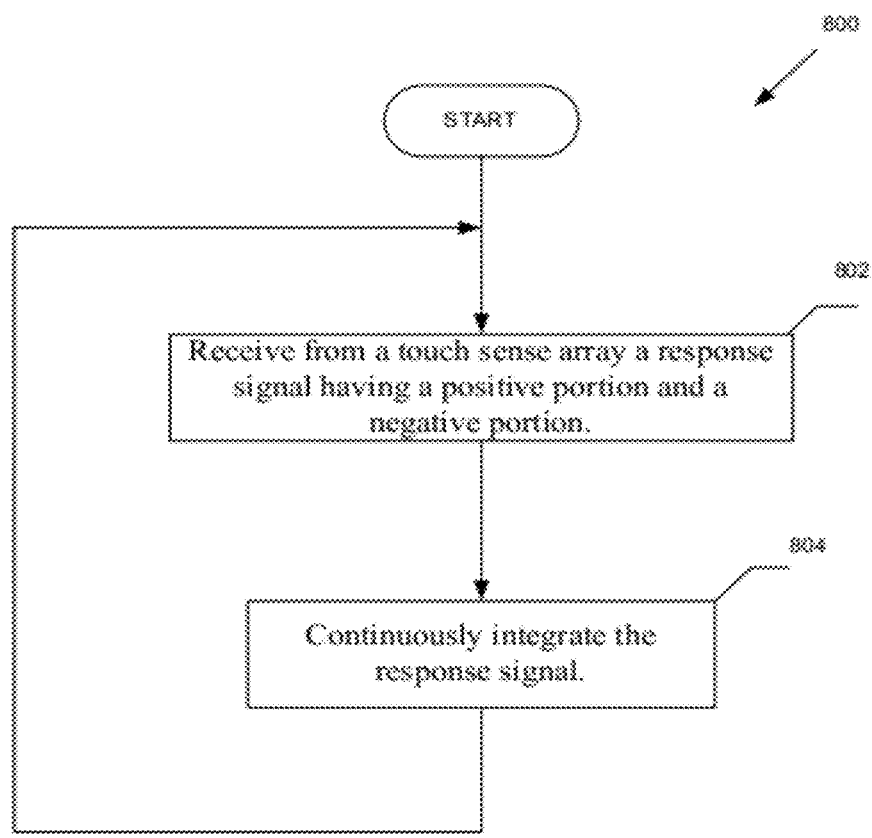
FIG. 8 is a flow diagram of one embodiment of a method for operating the active integrator and the S/H circuit of the active integration circuit for measuring a capacitance of the touch sense array

FIG. 8 is a flow diagram 800 of one embodiment of a method for operating the active integrator 326 and the S/H circuit 340 of the active integration circuit 300 for measuring a capacitance of the touch sense array 121. At block 802, the active integrator 300 receives from the touch sense array 121 a response signal having a positive portion and a negative portion (e.g., a periodic response signal having a positive portion followed by a, negative portion such as a sine wave, a square wave, a triangle wave, etc.). The response signal is representative of a presence or an absence of a conductive object on the touch sense array 121. At block 804, the active integrator 300 continuously integrates the response signal (in a full-wave rectification fashion, see FIG. 8 below). Blocks 802 and 804 are repeated ad infinitum for each cycle of the response signal for as long as the response signal is present.

Figure 9:
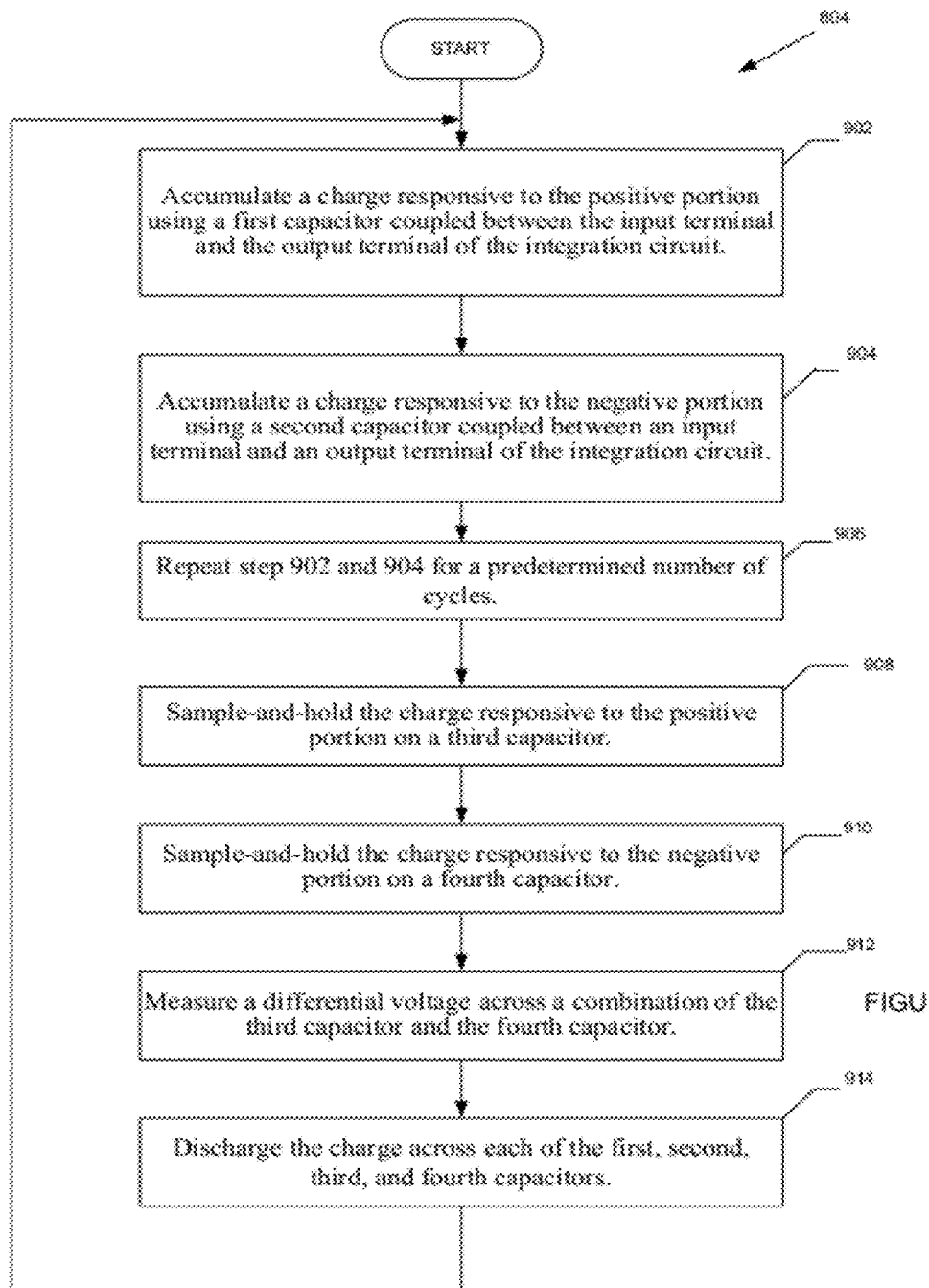
FIG. 9 is a flow diagram illustrating the step of continuously integrating the response signal of FIG. 9 in greater detail.

FIG. 9 is a flow diagram illustrating block 804 of continuously integrating the response signal of FIG. 8 in greater detail. Referring now to FIGS. 4, 5 and 9, at block 902, a charge responsive to the positive portion of the response signal is accumulated on the first integrating capacitor 456, $C_{INTP}$. More particularly, when a TX signal 227 is activated to go from low-to-high, corresponding switches 458a, 458b (p1/p1p) in the active integrator 326 are closed, while switches 462a, 462b (p2/p2p) are opened. Incoming charge may then be integrated on the capacitor 456 ($C_{INTP}$), such that the voltage across the capacitor 456 produces a voltage at the output of the integrator (i.e., node 454). The input side of the integration capacitor 450 is held constant at Vx, which is the same as Vy (i.e., node 452), which does not change in operation.

At block 904, a charge responsive to the negative portion of the response signal is accumulated on the second integrating capacitor 460, $C_{INTN}$. More particularly, after all signals have settled down, the TX signal 227 is directed by the sequencer 345 to apply a high-to-low transition while simultaneously switches 458a, 458b (p1/p1p) are opened and switches 462a, 462b (p2/p2p) are closed. This connects the capacitor 460 ($C_{INTN}$) to the active integrator 326 while the capacitor 456 ($C_{INTP}$) is left floating, thereby temporarily holding its charge (the charge on the capacitor 456 cannot leak off). Again, after the incoming charge has been integrated, at block 906, the cycle starts over, switching the capacitor 456 ($C_{INTP}$) back into the active integrator 326 to collect a next charge packet, and so forth. Thus, positive charge packets are accumulated on capacitor 456 ($C_{INTP}$), while negative packets are accumulated on capacitor 460 ($C_{INTN}$).

While the positive and negative charges are producing corresponding positive and negative voltages across capacitor 456 ($C_{INTP}$) and capacitor 460 ($C_{INTN}$), relative to node 450 (Vy), at blocks 908, 910, respectively, output sampling capacitors 466 ($C_{SHP}$) and 469 ($C_{SHN}$) have been connected/removed to/from the integrator output 454 via corresponding non-overlapping closure/opening of the pair of switches 468a-468b (shp) and the pair of switches 470a-470b (shn), respectively. As a result, the output sampling capacitors 466 ($C_{SHP}$) and 469 ($C_{SHN}$) carry the same voltages across them as the corresponding integration capacitors, 456, 460, respectively.

After a predetermined number of cycles, N, at block 912, the downstream ADC 217 of FIG. 2 is directed by the sequencer 345 to measure the differential voltage across the capacitors 466 ($C_{SHP}$) and 469 ($C_{SHN}$) (referred to as a "sub-integration"), at which point, in block 914, the capacitors 456, 460, 466, and 469 are reset, and the whole process starts over. This differential voltage represents the difference in the positive and negative charge across the capacitors 456 ($C_{INTP}$) and 460 ($C_{INTN}$), respectively. As a result, both half-cycles of any TX pulse are added together, which amounts to a full-wave rectification. Although both half cycles are integrated in discrete steps, with very short interruptions between them to accommodate switch-over of the integration capacitors, this operation is referred to as substantially "continuous" integration.

More particularly, the S/H circuit 340 operated in three stages to present a differential voltage to the ADC 217. The three stages include sampling from the integrator circuit 326, holding the sampled charge on the S/H circuit 340, and driving the ADC 217. The following steps describe the signals involved.

Each of the S/H buffers 467a, 467b samples the integrator output 454 on the last Tx clock period. The positive S/H buffer 467a samples the positive integration capacitor 456 ($C_{INTP}$) (nominally when the Tx has it's last high edge) and the negative S/H buffer 467a samples the negative integration capacitor integration capacitor 460 ($C_{INTN}$) (when the Tx has its last low edge). The first signal to transition are the buffer power up signals 471a, 471b (bufp_pdb and bufn_pdb). The S/H buffers 467a, 467b are dynamically powered so they only consume current when required during the sample phase (shp) and during the drive ADC phase (adc_sample). In the sample mode, switch 470a (shpp) is operated to put the S/H buffer 467a into a unity gain mode and to set up $V_Y$ on the right hand side of the sampling capacitors 466a ($C_{SHP}$) and 466b ($C_{SHN}$). Switch 468a (shp) is operated to sample the positive input (from the active integrator 326) on the sample/hold capacitor 466a ($C_{SHP}$). When both of these signals return to zero, the S/H buffers 467a, 467b are powered down via inputs 471a, 471b (bufp_pdb and bufn_pdb), one node of the sample/hold capacitor 468a ($C_{SHP}$) is tied to $V_Y$ via switch 470b (!shp && !adc_sample) and the second node is floating. This allows a 'hold' of the sampled positive integrator voltage on $C_{SHP}$. A similar operation samples and holds the negative integrator voltage on sample/hold capacitor 466b ($C_{SHN}$). Just before adc_sample transitions, the S/H buffers 467a, 467b are again powered up (bufp_pdb and bufn_pdb), both $C_{SHP}$ and $C_{SHN}$ are put in feedback around their respective buffers and the SAR capacitors $C_{ADCP}$ and $C_{ADCN}$ within the ADC 217 are charged to the values stored on $C_{SHP}$ and $C_{SHN}$.

This time-overlapping continuous integration at the input and output of the active integrator 326 results in faster sensor panel scan time, which can also reduce operational current. A reduction in operational current may reduce battery consumption, which is particularly important in batter-operated systems having touch sense arrays.

In another embodiment of the active integration circuit 300, the single input, dual output S/H circuit 340 may be eliminated and the ADC 217 may be replaced with a sufficiently fast single input ADC. With a sufficiently fast ADC, the ADC may rapidly sample the positive going and negative going signals emanating from the integrator circuit 326 on the output 454 directly and then the processing core 102 may subtract the two signals digitally.

Figure 10:
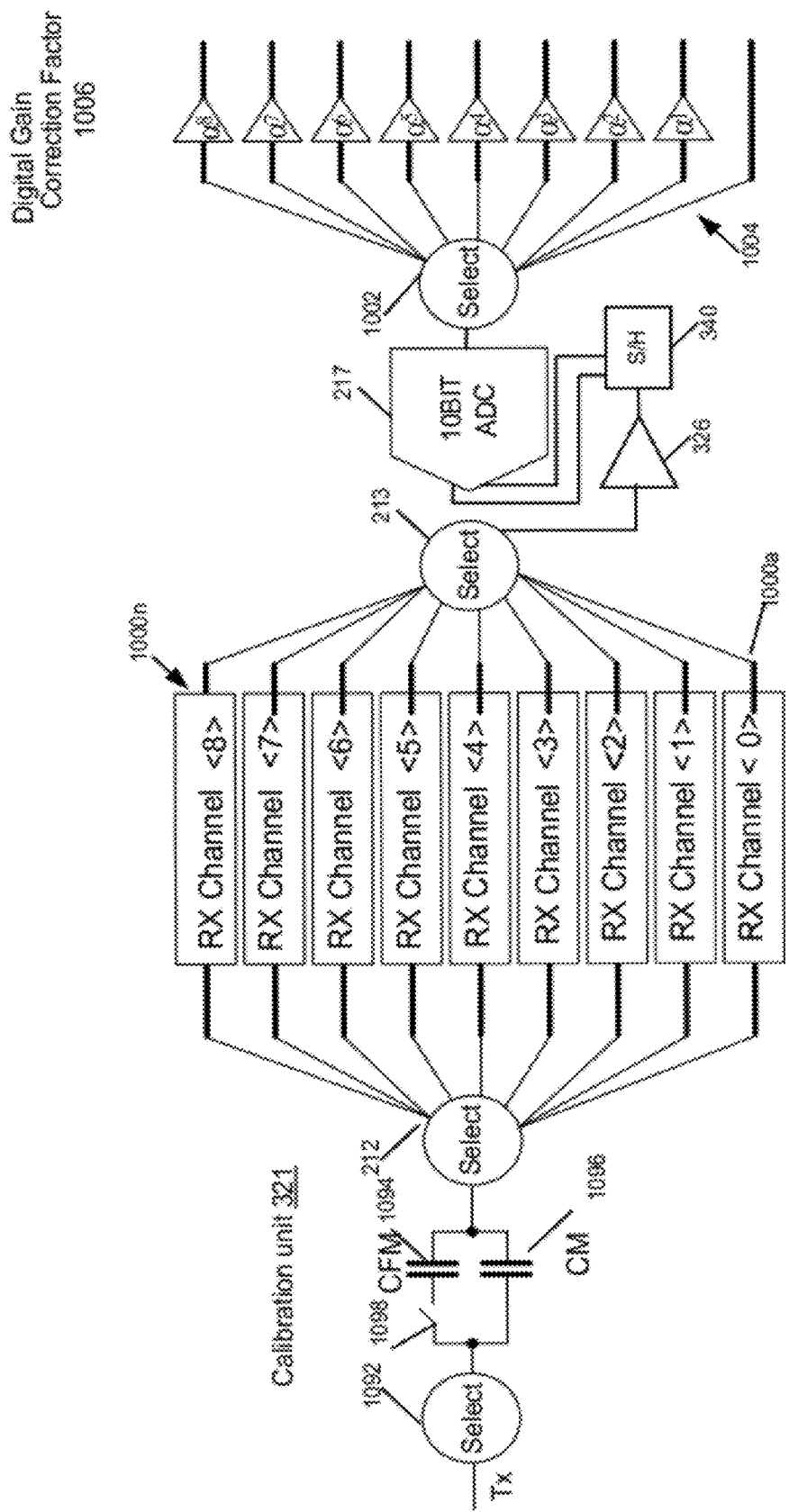
FIG. 10 is another embodiment of FIG. 2 showing the capacitance sensor of FIG. 2 configured to provide a calibration unit configured to provide a self-calibration of the capacitance sensor.

FIG. 10 is another embodiment of FIG. 2 showing the sensing circuit 101 configured to provide a calibration unit 321 configured to provide a self-calibration of the sensing circuit 101 and coupled between the input TX signal 227 and the RX channels inside unit 300 via a selection circuit 1092 and the demultiplexer 212. The calibration unit 321 effectively replaces the function of the sensor panel during the self-calibration mode. The calibration unit 321 comprises a first capacitor 1094, also labeled CFM, a second capacitor 1096, also labeled CM, and a switch 1098 in series with the second capacitor 1096. The calibration unit 321 is configured to facilitate calibration of the sensing circuit 101 by using the capacitors 1094, 1096 to simulate an absence and a presence of a conductive object. The calibration unit 321 can be used to calibrate for mutual capacitance sensing, as well as self capacitance sensing. For example, a touch event can be simulated by the switch 1098 being opened, and a no-touch event can be simulated by the switch 1098 being closed, respectively (i.e., since the value of the mutual capacitance is actually reduced during touch). Using these on-chip capacitors, a touch-like signal can be produced which permits a measurement (and subsequent correction) of each channel's front-to-end gain. After calibration is complete, all channels exhibit the same overall gain to a real touch signal, which significantly improves the calculation accuracy of the finger-touch location. A method for gain calibration may include programming of the actual capacitance value of each of the integration capacitors (or a digital value 1004).

In self calibration mode, each channel 1000a-1000n of the touch sense array 121 may be further calibrated by scanning through the channels 1000a-1000n one at a time via the demultiplexor 212, multiplexor 213, the active integrator 326, the sample-and-hold circuit 340, and the ADC 217, which in turn is digitally interfaced to the processing core 102. In an embodiment, a selected one of the channels 1000a-1000n is continuously integrated by the active integrator 326, the sample-and-hold circuit 340, and the ADC 217 according to the method illustrated in FIG. 8. A selection circuit 802 and two or more gain correction values 804 are simulated in software within the processing core 102 for digitally calibrating channel variance due to component variations within and between the same or different touch sense arrays 121 during factory or in-service operation of the sensing circuit 101. Some or all of the components 1002, 1004 may be implemented using other techniques as would be appreciated by one of ordinary skill in the art having the benefit of this disclosure.

Returning again to FIG. 10, resulting calibration values 1004 are stored in memory and may be applied as a "digital gain correction" factor to each output of the channels 1000a-1000n. Digital gain correction improves touch location accuracies.

Returning to FIG. 4, in an embodiment, the first integrating capacitor 456 and the second integrating capacitor 460 may be variable/programmable capacitors to permit a second degree of gain correction for eliminating channel gain variances.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit comprising:
    an active integrator configured to measure a capacitance of a touch sense array, wherein the active integrator is configured to receive from the touch sense array a response signal comprising a positive portion and a negative portion, wherein the response signal is representative of a presence or an absence of a conductive object proximate to the touch sense array, the active integrator comprising a first integrating capacitor, and
    a second integrating capacitor, wherein the first integrating capacitor or the second integrating capacitor are configured to be alternately coupled in a feedback configuration between an output terminal of the active integrator and a first input terminal of the active integrator, the first integrating capacitor in the feedback configuration to integrate the positive portion of the response signal and the second integrating capacitor in the feedback configuration to integrate the negative portion of the response signal.

2. The circuit of claim 1, wherein the active integrator comprises a switched capacitor integrator.

3. The circuit of claim 1, wherein the active integrator is configured to have a pass-band centered about a fundamental frequency of the response signal.

4. The circuit of claim 1, wherein
    the first integrating capacitor is coupled to the output terminal of the active integrator and the first input terminal of the active integrator, wherein the first integrating capacitor is configured to store a charge responsive to the positive portion of the response signal, and
    the integrating capacitor is coupled to the output terminal of the active integrator and the first input terminal of the active integrator, wherein the second integrating capacitor is configured to store a charge responsive to the negative portion.

5. The circuit of claim 4, further comprising:
    a first switch configured to connect or disconnect the first integrating capacitor between the output terminal and the first input terminal; and
    a second switch connect to connect or disconnect the second integrating capacitor between the output terminal and the first input terminal.

6. The circuit of claim 5, wherein the first switch is closed responsive to the positive portion and open responsive to the negative portion, and wherein the second switch is closed responsive to the negative portion and open responsive to the positive portion.

7. The circuit of claim 1, further comprising a baseline compensation circuit coupled to a second input terminal of the active integrator and configured to minimize a direct current (DC) component of the response signal.

8. The circuit of claim 7, wherein the baseline compensation circuit comprises:
    a digital-to-analog (D/A) converter;
    a gain circuit coupled to the D/A converter; and
    a first switch and a second switch, each coupled to the gain circuit and the second input terminal of the active integrator, wherein the first switch is configured to apply a negative signal to the second input terminal of the active integrator when the positive portion is present, and wherein the second switch is configured to apply a positive signal to the second input terminal of the active integrator when the negative portion is present.

9. The circuit of claim 1, further comprising
    a sample-and-hold circuit, wherein the active integrator is configured to integrate at least a portion of the response signal while providing the sample-and-hold circuit with an output signal of the active integrator, the sample-and-hold circuit comprising a first capacitor arranged to hold a positive output signal from the active integrator, which is responsive to the positive portion and a second capacitor arranged to hold a negative output signal from the active integrator, which is responsive to the negative portion, and wherein the sample-and-hold circuit is coupled to an output terminal of the active integrator, wherein the output signal of the active integrator is impressed upon the sample-and-hold circuit.

10. The circuit of claim 9, wherein the sample-and-hold circuit comprises:
the first capacitor and a first switch connected in series and coupled between the output terminal of the active integrator and a first input terminal of an analog-to-digital converter (ADC); and
the second capacitor and a second switch connected in series and coupled between the output terminal of the active integrator and a second input terminal of the ADC, wherein the first switch is configured to cause the first capacitor to hold the positive output signal of the output terminal of the active integrator when the positive portion is present, and wherein the second switch is configured to cause the second capacitor to hold the negative output signal on the output terminal of the active integrator when the negative portion is present.

11. The circuit of claim 1, further comprising a self-calibration circuit coupled between an input signal source and the touch sense array.

12. The circuit of claim 11, wherein the self-calibration circuit comprises:
a first capacitor coupled between the input signal source and the touch sense array;
a second capacitor coupled between the input signal source and the touch sense array; and
a switch in series with the second capacitor, wherein the switch is configured to insert or remove the first capacitor to simulate a presence or an absence of a touch object.

13. The circuit of claim 1, further comprising a mode select circuit coupled to the active integrator and configured to permit the active integrator to integrate in a self-capacitance sensing mode and a mutual-capacitance sensing mode.

14. A method, comprising:
receiving a response signal at an active integrator from a touch sense array, the response signal comprising a positive portion and a negative portion, wherein the response signal is representative of a presence or an absence of a conductive object proximate to the touch sense array; and
alternately integrating, by a first integrating capacitor or a second integrating capacitor of the active integrator, the positive portion or the negative portion of the response signal, wherein the first integrating capacitor or the second integrating capacitor are configured to be alternately coupled in a feedback configuration between an output terminal of the active integrator and a first input terminal of the active integrator, the first integrating capacitor in the feedback configuration to integrate the positive portion of the response signal and the second integrating capacitor in the feedback configuration to integrate the negative portion of the response signal continuously integrating the response signal includes integrating at least a portion of the response signal while sample-and-holding an output of the active integrator, wherein sample-and-holding the output of the active integrator includes sample-and-holding the output corresponding to the positive portion during a first period and sample-and-holding the output corresponding to the negative portion during a second period.

15. The method of claim 14, wherein alternately integrating the positive portion or the negative portion of the response signal further comprises:

(a) accumulating a charge responsive to the positive portion using the first integrating capacitor coupled between the first input terminal and the output terminal of the active integrator;
(b) accumulating a charge responsive to the negative portion using the second integrating capacitor coupled between the first input terminal and the output terminal of the active integrator; and
(c) repeating steps (a) and (b) for a predetermined number of cycles.

16. The method of claim 15, wherein said steps (a) and (b) further comprise:
sampling and holding an output of the active integrator, the sampling and holding comprising:
sampling and holding the charge responsive to the positive portion on a third capacitor coupled between the output terminal of the active integrator and a first input terminal of an analog-to-digital converter (ADC), and
sampling and holding the charge responsive to the negative portion on a fourth capacitor coupled between the output terminal of the active integrator and a second input terminal of the ADC.

17. The method of claim 16, wherein said steps (a) and (b) further comprise:
(d) measuring a differential voltage across a combination of the third capacitor and the fourth capacitor;
(e) discharging charge across each of the first, second, third, and fourth capacitors; and
(f) repeating steps (a)-(e).

18. The method of claim 14, further comprising:
applying a baseline compensation to a first input terminal of the active integrator by applying a negative signal to the first input terminal concurrently with the positive portion
and applying a positive signal to the first input terminal concurrently with the negative portion.

19. An apparatus, comprising:
a touch sense array; and
an active integrator configured to measure a capacitance of the touch sense array, wherein the active integrator is configured to receive from the touch sense array a response signal comprising a positive portion and a negative portion, wherein the response signal is representative of a presence or an absence of a conductive object proximate to the touch sense array, the active integrator comprising
a first integrating capacitor, and
a second integrating capacitor, wherein the first integrating capacitor or the second integrating capacitor are configured to be alternately coupled in a feedback configuration between an output terminal of the active integrator and a first input terminal, the first integrating capacitor in the feedback configuration to integrate the positive portion of the response signal and the second integrating capacitor in the feedback configuration to integrate the negative portion of the response signal.

20. The apparatus of claim 19, further wherein
the first integrating capacitor in the feedback configuration is configured to store a charge responsive to the positive portion, and
the second integrating capacitor in the feedback configuration is configured to store a charge responsive to the negative portion.

* * * * *